(12) United States Patent
Dieny et al.

(10) Patent No.: US 10,056,266 B2
(45) Date of Patent: Aug. 21, 2018

(54) METHOD FOR MANUFACTURING A RESISTIVE DEVICE FOR A MEMORY OR LOGIC CIRCUIT

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Grenoble (FR)

(72) Inventors: Bernard Dieny, Lans en Vercors (FR); Maxime Darnon, Pavezin (FR); Gabriele Navarro, Grenoble (FR); Olivier Joubert, Meylan (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Grenoble (FR)

( * ) Notice: Subject to any disclaimer, the term of this patent is extended or adjusted under 35 U.S.C. 154(b) by 0 days.

(21) Appl. No.: 15/520,132

(22) PCT Filed: Oct. 15, 2015

(86) PCT No.: PCT/EP2015/073897
§ 371 (c)(1),
(2) Date: Apr. 19, 2017

(87) PCT Pub. No.: WO2016/062613
PCT Pub. Date: Apr. 28, 2016

(65) Prior Publication Data
US 2017/0309497 A1    Oct. 26, 2017

(30) Foreign Application Priority Data

Oct. 20, 2014  (FR) .................................... 14 60073

(51) Int. Cl.
*H01L 27/22*  (2006.01)
*H01L 27/24*  (2006.01)
(Continued)

(52) U.S. Cl.
CPC ...... *H01L 21/4763* (2013.01); *C23C 14/3407* (2013.01); *H01L 27/22* (2013.01);
(Continued)

(58) Field of Classification Search
CPC ....... H01L 45/06; H01L 45/08; H01L 45/085; H01L 45/1233; H01L 45/1253;
(Continued)

(56) References Cited

U.S. PATENT DOCUMENTS 6,153,443 A    11/2000 Durlam et al.
6,751,073 B2 *  6/2004 Hasegawa ............ B82Y 10/00
                                              257/E43.004
(Continued)

FOREIGN PATENT DOCUMENTS

FR        3027 453      *  4/2016 ............. H01L 45/00
WO   WO 02/05336 A1         1/2002
(Continued)

OTHER PUBLICATIONS

Preliminary Search Report as issued in French Patent Application No. 1460073, dated Jun. 19, 2015.
(Continued)

*Primary Examiner* — Mary Wilczewski
(74) *Attorney, Agent, or Firm* — Pillsbury Winthrop Shaw Pittman LLP

(57) ABSTRACT

A method for manufacturing a resistive device, includes depositing a first electrically conductive layer on a substrate;
(Continued)

forming an etching mask on the first conductive layer; etching the first conductive layer through the mask, such as to obtain a plurality of electrically conductive pillars separated from one another; and forming storage elements with variable electrical resistance at the tops of the electrically conductive pillars, such that each storage element is supported by one of the electrically conductive pillars, the step of forming the storage elements including the following operations depositing a first layer by non-collimated cathode sputtering at normal incidence relative to the substrate; and depositing a second layer on the first layer by cathode sputtering, the second layer including a first chemical species sputtered at an oblique incidence.

20 Claims, 10 Drawing Sheets

(51) Int. Cl.
*H01L 45/00* (2006.01)
*C23C 14/34* (2006.01)
*H01L 21/4763* (2006.01)

(52) U.S. Cl.
CPC ............ *H01L 27/24* (2013.01); *H01L 27/222* (2013.01); *H01L 27/2463* (2013.01); *H01L 45/00* (2013.01); *H01L 45/06* (2013.01); *H01L 45/08* (2013.01); *H01L 45/085* (2013.01); *H01L 45/1233* (2013.01); *H01L 45/1253* (2013.01); *H01L 45/16* (2013.01)

(58) Field of Classification Search
CPC ... H01L 45/16; H01L 27/222; H01L 27/2463; H01L 27/24
See application file for complete search history.

(56) References Cited

U.S. PATENT DOCUMENTS

| | | | | |
|---|---|---|---|---|
| 6,818,961 | B1* | 11/2004 | Rizzo | B82Y 25/00 257/421 |
| 7,178,222 | B2* | 2/2007 | Hasegawa | B82Y 10/00 216/22 |
| 7,443,635 | B2* | 10/2008 | Tanaka | B82Y 25/00 29/603.12 |
| 9,017,535 | B2* | 4/2015 | Nagamine | H01L 43/12 118/728 |
| 9,431,608 | B2* | 8/2016 | Perniola | G11C 11/005 |
| 9,928,860 | B2* | 3/2018 | Schlage | G11B 5/3906 |
| 2001/0003678 | A1 | 6/2001 | Stinnett et al. | |
| 2002/0006020 | A1* | 1/2002 | Hasegawa | B82Y 10/00 360/324.2 |
| 2004/0047083 | A1* | 3/2004 | Hasegawa | B82Y 10/00 360/324.2 |
| 2004/0104411 | A1 | 6/2004 | Joubert et al. | |
| 2005/0174838 | A1* | 8/2005 | Ruehrig | G11C 11/14 365/174 |
| 2006/0073631 | A1 | 4/2006 | Karpov et al. | |
| 2008/0247214 | A1 | 10/2008 | Ufert | |
| 2008/0280411 | A1 | 11/2008 | Chang | |
| 2009/0104779 | A1 | 4/2009 | Seko et al. | |
| 2009/0211897 | A1* | 8/2009 | Tsunekawa | C23C 14/165 204/192.13 |
| 2010/0000855 | A1 | 1/2010 | Nakamura et al. | |
| 2010/0078310 | A1* | 4/2010 | Tsunekawa | B82Y 25/00 204/192.2 |
| 2010/0080894 | A1* | 4/2010 | Tsunekawa | B82Y 25/00 427/131 |
| 2010/0108974 | A1 | 5/2010 | Park | |
| 2010/0200394 | A1* | 8/2010 | Nagamine | C23C 14/081 204/192.13 |
| 2010/0213047 | A1* | 8/2010 | Nagamine | H01L 43/12 204/192.12 |
| 2012/0070693 | A1 | 3/2012 | Abarra et al. | |
| 2013/0095634 | A1* | 4/2013 | Takahashi | H01L 45/1683 438/382 |
| 2013/0200323 | A1* | 8/2013 | Pham | H01L 45/1608 257/4 |
| 2013/0200324 | A1* | 8/2013 | Pham | H01L 45/1253 257/4 |
| 2014/0124881 | A1 | 5/2014 | Kwon et al. | |
| 2015/0064499 | A1* | 3/2015 | Schlage | G11B 5/3906 428/811.3 |
| 2016/0111642 | A1* | 4/2016 | Perniola | G11C 11/005 257/2 |
| 2017/0309497 | A1* | 10/2017 | Dieny | H01L 21/4763 |

FOREIGN PATENT DOCUMENTS

| | | | |
|---|---|---|---|
| WO | WO 03/005349 A1 | 1/2003 | |
| WO | WO 2016/062613 | * 4/2016 | ............ H01L 45/00 |

OTHER PUBLICATIONS

International Search Report as issued in International Patent Application No. PCT/EP2015/073897, dated Dec. 17, 2015.

Chen, W.S., et al., "A Novel Cross-Spacer Phase Change Memory with Ultra-Small Lithography Independent Contact Area," IEEE, 2007, pp. 319-322.

Moritz, J., et al., "Writing and reading bits on pre-patterned media," Applied Physics Letters, vol. 84, No. 9, 2004, pp. 1519-1521.

Lai, S.C., et al., "A Scalable Volume-Confined Phase Change Memory Using Physical Vapour Deposition," Symposium of VLSI Technology Digest of Technical Papers, 2013, pp. T132-T133.

* cited by examiner

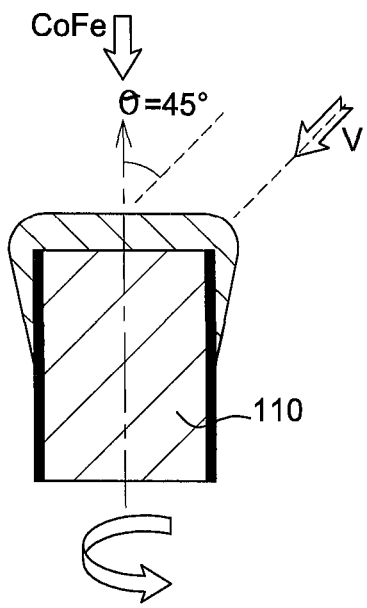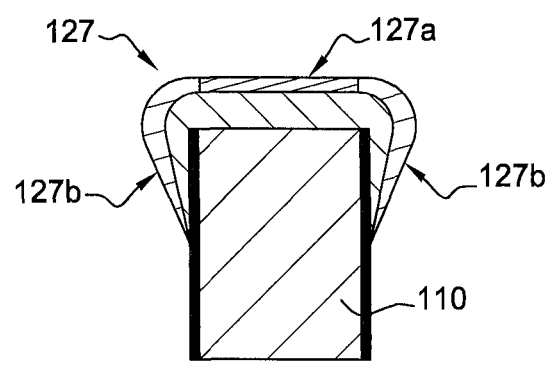
Fig. 11A             Fig. 11B
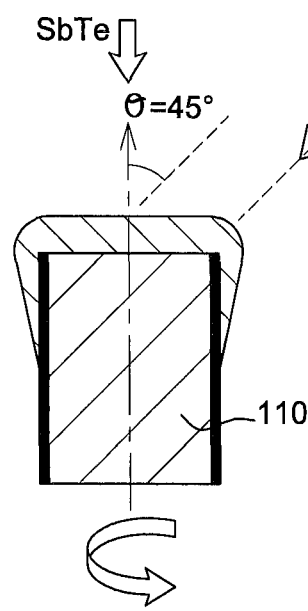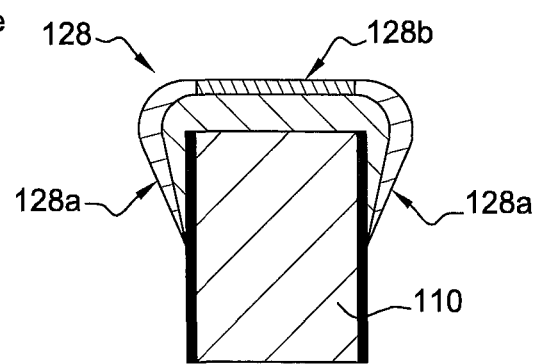
Fig. 12A             Fig. 12B

METHOD FOR MANUFACTURING A RESISTIVE DEVICE FOR A MEMORY OR LOGIC CIRCUIT

CROSS REFERENCE TO RELATED APPLICATIONS

This is the U.S. National Stage of PCT/EP2015/0738987, filed Oct. 15, 2015, which in turn claims priority to French Patent Application No. 1460073, filed Oct. 20, 2014, the entire contents of all applications are incorporated herein by reference in their entireties.

TECHNICAL FIELD

The present invention relates to a resistive device of non-volatile memory type or of logic type, comprising a plurality of storage elements with variable electrical resistance, also known as memory points or logic units.

PRIOR ART

Several non-volatile memory technologies are under development with various degrees of maturity. Phase change random access memories (PCRAM), conductive bridge random access memories (CBRAM) or oxide based random access memories OxRAM, ferroelectric random access memories (FeRAM) and magnetic random access memories (MRAM) may notably be cited. Apart from FeRAM, which operate according to the principle of the orientation of an electric dipolar moment in a ferroelectric material, all the other memories use materials of variable electrical resistance. Each information bit is stored in an element of variable resistance and encoded by the resistance value of this storage element (typically the logic level '0' corresponds to a high resistance value and the logic level '1' corresponds to a low resistance value).

The mechanism behind the variation in resistance depends on the technology used. In PCRAM, for example, it is semi-conductor chalcogenide materials that can be made to pass from an amorphous state to a crystalline state (or vice versa) by current pulses of appropriate amplitude and duration. In MRAM, the storage element is a magnetic tunnel junction having a magnetoresistance tunnel effect. In CBRAM, conductive filaments are formed or destroyed by making metal species (for example Ag) diffuse in a semi-conductor matrix (for example Ge). All the forms of memory involve the passage of a current through the storage element, which has an electrical resistance varying between a minimum value and a maximum value.

In microelectronics, one of the techniques commonly used for etching materials in industrial methods is reactive plasma etching. This reactive plasma etching normally forms volatile compounds by reaction between the etched material and the constituents of the plasma (conventionally based on $Cl_2$, HBr, $SF_6$, $CF_4$, $O_2$, $NH_3$, CO, $CH_3OH$, etc.), these volatile compounds then being pumped outside of the etching enclosure. The problem encountered with materials of MRAM (various magnetic and non-magnetic materials constituting the magnetic tunnel junction, for example Pt, Pd, CoFe, NiFe, CoFeB, PtMn, IrMn, MgO and NiO), CBRAM (chalcogenides of GeSbTe or InSbTe type) and certain OxRAM ($CaTiO_3$, $PrCaMnO_3$ and other transition metal oxides) is the absence of volatile compounds or, on the contrary, a too reactive etching of the materials, which makes dimensional control difficult (case of GeSbTe notably) and modifies the properties of the materials (for example the rate of crystallisation of GeSbTe). When the etching residues are not volatile, they cannot be evacuated and are re-deposited on the substrate during etching. These residues also have a tendency to line the walls of the etching frame, leading to problems of reproducibility and defectiveness. In addition, the gases used to generate the reactive plasma may corrode the materials to be etched.

The etching of these "memory" materials may also be carried out by a bombardment of ions of neutral gas, typically argon. Nevertheless, this technique, known as IBE (Ion Beam Etching), gives results of insufficient quality for an industrial method. Indeed, several problems are posed:

The IBE technique leads to a high number of defects at the edges of the structures that form the storage elements and to an important variability in electrical or magnetic properties from one memory point to another.

Since the etching residues are not volatile, they pollute the substrate and the etching frame, like plasma etching. In particular, they are deposited on the sides of the structures, which alter the electrical properties of the storage elements. For example, in the case of a magnetic tunnel junction, etching of the upper magnetic electrode may lead to metal deposition on the sides of the structure, which short-circuit the tunnel barrier.

Storage elements etched by IBE have inclined sides, which is a hindrance for high density applications where the memory points are very close to each other.

Uniform etching on substrates of diameter greater than or equal to 300 mm is difficult to obtain, because the flux of ions is not homogeneous on such a surface.

No solution has thus been found until now for etching, in a satisfactory manner, the materials of storage elements used in MRAM, OxRAM and CBRAM non-volatile memories, notably those of resolution less than 30 nm. Furthermore, the same problems are posed in the field of logic components, and more particularly MLU (Magnetic Logic Units) which each comprise a magnetic tunnel junction etched by IBE or reactive plasma etching.

The "damascene" method constitutes an alternative to plasma etching (IBE or reactive plasma) for structuring the storage elements of MRAM, CBRAM and OxRAM. This method, normally used for the manufacture of metal interconnections of integrated circuits, consists in defining the imprint of the element in an insulating material, then depositing materials (magnetic, chalcogenides, oxides, etc., depending on the targeted memory technology) over the whole of the substrate. Chemical mechanical polishing makes it possible to remove the excess of materials outside of the imprint.

The document U.S. Pat. No. 6,153,443 gives an example of MRAM obtained thanks to the "damascene" method. Each memory point is constituted of a magnetic tunnel junction connected to a selection transistor through a via and a metal line. The transistor is produced using conventional CMOS technology, whereas the via and the tunnel junction are produced thanks to the "damascene" method. The different layers of the tunnel junction are deposited in cavities formed beforehand in an insulating material.

Thus, the "damascene" method makes it possible to do away with etching of memory materials. Nevertheless, successive depositions of materials on the sides of the cavities reduce the effective surface of the storage element and makes the control of the thickness of the layers deposited on these sides difficult. This is particularly true for MRAM, which can stack a large number of magnetic and non-magnetic layers of very low thickness, the tunnel barrier layer having for example a thickness of the order of 1 nm.

If the thickness of the barrier layer becomes too low at the level of the sides of the cavities, electrical short-circuits may occur through this barrier, making the tunnel junction unusable.

The document US2014/0124881 describes a MRAM, PCRAM or OxRAM type resistive memory arranged in the form of a matrix of memory points. This memory comprises a plurality of conductive pillars arranged vertically on a semi-conductor substrate and separated from one another. These conductive pillars each support a storage element. The pillars have rectilinear or arc of circle sides and a section at their base smaller than at their top. The shape of these pillars makes it possible to discretise the storage layer during its deposition, thus avoiding having to etch it. The pillars are formed by the "damascene" method and the storage layer is deposited by cathode sputtering, after partial removal of the dielectric situated between the pillars.

Despite the absence of etching, this structuring method generates in the memory points (or logic points) structural and/or chemical defects, which lead to a high variability in point to point properties, in particular a high dispersion of the electrical and retention properties of the memory point (that is to say its capacity to store information over time). The smaller the size of the points, the greater this dispersion, since the defects usually appear at the periphery of the points.

SUMMARY OF THE INVENTION

There thus exists a need to provide a method for manufacturing a resistive device leading to lower variability in electrical and retention properties between storage elements.

According to the invention, this need tends to be satisfied by providing a method for manufacturing a resistive device comprising the following steps:
  depositing a first electrically conductive layer on a substrate;
  forming an etching mask on the first conductive layer;
  etching the first conductive layer through the mask, such as to obtain a plurality of electrically conductive pillars separated from one another;
  forming storage elements with variable electrical resistance at the tops of the conductive pillars, such that each storage element is supported by one of the conductive pillars,
the step of forming the storage elements comprising the following operations:
  depositing a first layer by non-collimated cathode sputtering at normal incidence relative to the substrate; and
  depositing a second layer on the first layer by cathode sputtering, the second layer comprising a first chemical species sputtered at an oblique incidence.

Alternatively, the manufacturing method may comprise the following steps:
  forming vertical interconnection structures of damascene type made of electrically conductive material on a substrate, said vertical interconnection structures being distributed within a dielectric layer;
  thinning the dielectric layer such as to free at least partially said vertical interconnection structures; and
  forming storage elements with variable electrical resistance at the tops of the vertical interconnection structures, such that each storage element is supported by one of the vertical interconnection structures,
the step of forming the storage elements comprising the following operations:
  depositing a first layer by non-collimated cathode sputtering at normal incidence relative to the substrate; and
  depositing a second layer on the first layer by cathode sputtering, the second layer comprising a first chemical species sputtered at an oblique incidence.

According to a development of the manufacturing method, the second layer of the storage elements comprises a second chemical species different from the first chemical species and sputtered at normal incidence relative to the substrate, at the same time as the first chemical species.

Preferably, the substrate is rotationally driven when the first chemical species is sputtered at an oblique incidence

BRIEF DESCRIPTION OF THE FIGURES

Other characteristics and advantages of the invention will become clearer from the description that is given thereof below, for indicative purposes and in no way limiting, with reference to the appended figures, among which:

FIGS. 11A and 11B represent the formation of a first example of storage element having a local variation in chemical composition;

FIGS. 12A and 12B represent the formation of a second example of storage element having a local variation in chemical composition;

For greater clarity, identical or similar elements are marked by identical reference signs in all of the figures.

DETAILED DESCRIPTION OF AT LEAST ONE EMBODIMENT

In the description that follows, "resistive material" designates the material(s) that constitute the variable resistance storage element. It may be a conductive material playing the role of electrode or active material, that is to say that which fulfils the storage (or memory) function.

In order to structure the storage elements more easily, and thus to obtain elements of better workmanship, a substrate having a plurality of mesa-shaped electrically conductive pillars is used. These pillars, or pads, are separated from one another and have overhanging sides, such that when each resistive material of the storage element is deposited, the layer of this material is discretised at the tops of the pillars and between the pillars. In other words, this substrate makes it possible to structure the storage elements at the tops of the pillars naturally, without it being necessary to etch the resistive material retrospectively.

The pillars have a flared shape (at least partially) and a section at their base smaller than at their top. They are sufficiently electrically insulated from each other, despite the presence of resistive material at the bottom of the trenches separating the pillars, thanks to the fact that the material does not cover the sides at the base of the pillars. Indeed, the deposition of resistive material taking place according to a substantially directive method, preferably by physical vapour deposition (PVD) such as cathode sputtering or evaporation, the upper overhanging part of each pillar prevents, by shadow effect, the deposition of material at the foot of the sides.

Since the step of etching of the resistive material by IBE or plasma etching is done away with, the storage elements contain fewer structural or chemical defects on the edges (normally caused by IBE or reactive plasma etching). Consequently, the resistive device according to the invention has less variability from one memory point to another in terms of performances. Moreover, the storage elements do not risk being corroded, as is generally the case with reactive plasma etching. Their lateral walls may be vertical, rather than inclined, due to the absence of etching residues.

Finally, as will be described in detail hereafter, the fact of depositing the resistive material on pads etched beforehand makes it possible to play on the deposition incidences, in order to create lateral gradients of thickness or chemical composition at the scale of each pad.

Figure 1:
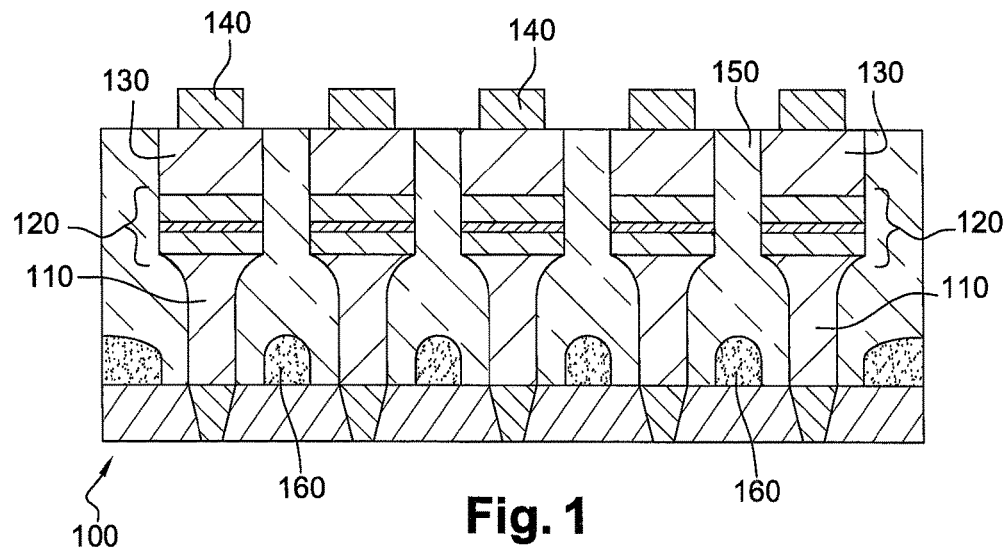
FIG. 1 represents a first embodiment of a resistive device with flared pillars according to the invention.

FIG. 1 represents, in section view, a first embodiment of a resistive device where the variable resistance storage elements are supported by flared conductive pillars.

The resistive device comprises a substrate 100 on which is arranged a set of pillars 110 made of electrically conductive material, for example tantalum. The pillars 110 are oriented vertically with respect to the plane of the substrate 100. Preferably, their section, measured in a plane parallel to the substrate 100, varies in a strictly increasing manner from the base to the top of the pillars. In other words, the section of the pillars 110 is minimum at their base and maximum at their top.

The device further comprises a plurality of storage elements 120 arranged at the tops of the pillars 110. In the case of memory type applications, these storage elements 120 have an electrical resistance varying between two states in response to an electric stimulus, a low resistance state and a high resistance state. They may thus form memory points (of CBRAM, MRAM, OxRAM type, etc.) or logic units (notably magnetic). They may be formed of one or more layers, of which the material(s) vary depending on the nature of the device to produce, for example according to the type of memory envisaged. In the case of memristor type applications, intermediate resistance values situated between the low resistance state and the high resistance state are used.

Each storage element 120 is supported by one of the conductive pillars 110. Preferably, the resistive device comprises as many pillars 110 as there are storage elements 120, that is to say memory points (for memory applications) or logic units (for logic applications). The pillars 110 have, preferably, identical shape and dimensions. They are generally arranged in lines and columns on the substrate 100, to form a matrix of memory points.

Above each storage element 120, the resistive device advantageously comprises a covering element 130 made of electrically conductive material, which facilitates making electrical contact at the level of the storage element 120. Like the storage element, this covering element 130 is limited to the upper face of the pillar 110 that supports it. The material of the covering elements 130 may be identical or different to that of the conductive pillars 110. Finally, an electrical contact 140 is arranged on each covering element 130 and makes it possible to convey current to the storage element 120 (through the covering element 130).

As is represented in FIG. 1, the vertical structures formed by the conductive pillars 110, the storage elements 120 and the superimposed covering elements 130 are advantageously embedded in a dielectric material 150, which reinforces the solidity, from a mechanical point of view, of all the pillars and storage elements, and which further enables electrical contact to be made at the top of the layer 130.

Finally, there remains on the substrate 100 residual deposits 160 of resistive material(s) forming the storage elements 120. These residual deposits 160 have an irregular shape due to the shadow effects created by the projecting edges of the pillars 110. They are situated between the conductive pillars 110 and are electrically inactive. Thus, they do not perturb the operation of the device.

In this first embodiment, the sides of the pillars 110 have a notched profile. The section of each pillar 110 is firstly constant in a lower part of the pillar, then increases abruptly in its upper part, near to the top. This variation in section may be continuous, as illustrated in FIG. 1, or instead discontinuous.

Figure 2:
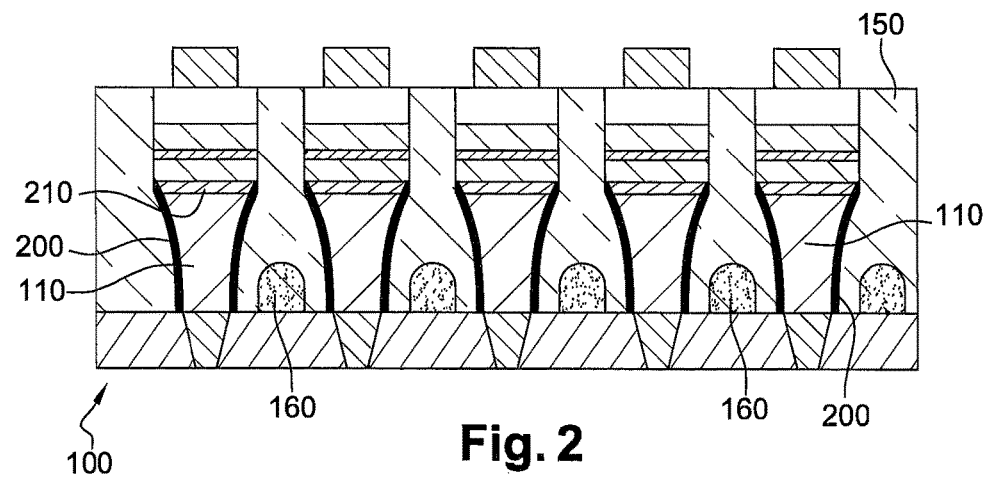
FIG. 2 represents a second embodiment of a resistive device with flared pillars according to the invention.

FIG. 2 represents a second embodiment, wherein the sides of the pillars 110 have an arc of circle or "bowing" shape and are covered with a layer 200 made of electrically insulating material. The section of the pillars varies in a continuous manner, for example increasing from the base to the top of the pillars, as is illustrated in FIG. 2. Otherwise, the section may decrease slightly from the base of the pillars then increase on approaching the top. In other words, the minimum section of the pillars is not necessarily that at the base of the pillars.

More generally, the pillars may be of varied shapes depending on the technology used. In particular, their section may be round, elliptical, square or rectangular.

The insulating layer 200 covers at least the portion of side situated at the base of the pillars 110, facing the residual deposits 160 of resistive material, and preferably the totality of the sides. It improves the electrical insulation between the different pillars 110. It proves particularly advantageous when the sides are slightly overhanging, that is to say when the section at the top is only slightly larger than the section at the base. In this situation, the residual deposit 160 situated between two neighbouring pillars 110 may be consequent and, if care is not taken in the selection of the dielectric material 150, a risk of short-circuit exists between these two pillars. This risk (or the constraints on the choice of dielectric material 150) is here eliminated by means of the insulating layer 200. In contrast, when the sides are considerably overhanging, the insulating layer 200 is not obligatory, because the residual deposit 160 is further away from the pillars 110.

To avoid the residual deposit 160 between the pillars touching the base of the pillars 110, it is preferable that the vertical projection in the plane of the substrate of the largest section of each pillar juts out by at least 2 nm in all directions from the section of the pillar at its base. This value may depend on the directivity of the deposition of the resistive element, but constitutes a lower limit for the case of a relatively directive deposition like that obtained by evaporation. In this situation, the insulating layer 200 on the sides of the pillars 110 is optional—because the insulation (by spacing between pillars and residual deposit) is already sufficient.

Besides, in this second embodiment, the device comprises a protective layer 210 situated at the tops of the pillars 110, at the interface between each pillar 110 and the corresponding storage element 120. This protective layer 210 prevents, when the layer 200 is formed on the sides of the pillars 110, producing simultaneously an insulating material on their upper face. In other words, the protective layer guarantees electrical continuity between each conductive pillar 110 and the storage element 120 arranged on this upper face. It is, preferably, formed of a noble metal or an electrically conductive oxide/nitride, for example ruthenium oxide (RuO).

The specificities of each embodiment, described above in relation with FIGS. 1 and 2, may of course be combined together. As an example, the sides of the pillars 110 may be notch shaped and covered with the insulating layer 200.

Figure 3:
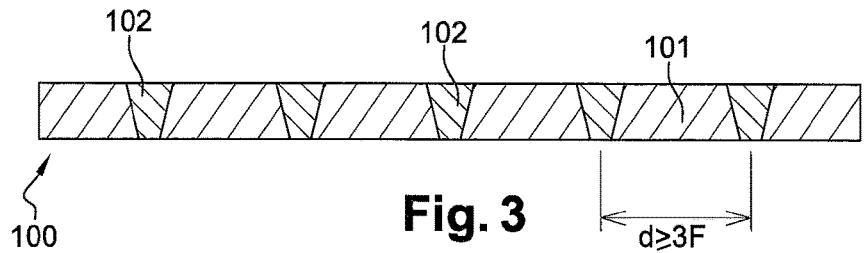
FIG. 3 schematically represents a substrate on which may be manufactured the resistive device according to the invention.

A method for manufacturing a resistive device according to any of these embodiments will now be described with reference to FIGS. 3, 4A to 4G. FIG. 3 shows the substrate 100 that serves as starting point for the method for manufacturing, whereas FIGS. 4A to 4G represent steps F1 to F7 of this method.

The substrate 100 conventionally comprises a CMOS circuit capable of addressing each memory point and reading the data recorded in the storage element, i.e. the electrical resistance value of this element. This circuit comprises, for example, selection transistors electrically connected to the conductive pillars by one or more interconnection levels. In FIG. 3, the final interconnection level before the memory points has been represented in transversal section uniquely. It is formed of a layer of dielectric material 101 (for example $SiO_2$ or $Al_2O_3$) traversed by interconnection patterns 102, such as conductive vias or conductive lines, typically made of metal (copper, aluminium, etc.). These interconnection patterns 102 make it possible to electrically connect the storage elements to the CMOS circuit.

For non-volatile memory applications, it is generally sought to integrate the storage elements as high as possible in the stack, in order to optimise the manufacturing process. Preferably, the conductive pillars of the resistive device are formed above one of the final metal levels.

The conductive vias (or conductive lines) 102 are (in current technologies) typically spaced apart by a distance d greater than or equal to 3F, where F designates the resolution of the resistive device, that is to say the minimum dimension that can be achieved by lithography (half-pitch). This value of 3F corresponds for example in CMOS technology to the distance separating two consecutive emerging vias of MOSFET transistors. The substrate 100 that serves as support to the pillars 110 generally occupies the entire surface of the memory circuit to manufacture. Nevertheless, in the case of a hybrid memory/logic circuit, the substrate 100 may correspond only to a portion of the circuit. The remainder of the circuit is then protected during the manufacture of the memory points by an insulating material or by a sacrificial material, which will be removed during, or at the end, of the method for manufacturing the circuit.

Of course, like any metal level of the substrate, the interconnection level of FIG. 3 may comprise patterns (via or line type) other than those intended to electrically connect the pillars 110 (and referenced 102). For example, these other patterns can connect a lower level to an upper level to that of the storage elements or two MOS transistors situated lower in the substrate. Furthermore, in the case of lines, they are not necessarily through lines.

Steps F1 to F7 described below in relation with FIGS. 4A to 4G make it possible to produce, on this starting substrate 100, resistive nanostructures connected in series with the conductive vias 102 and insulated from each other.

Figure 4A:
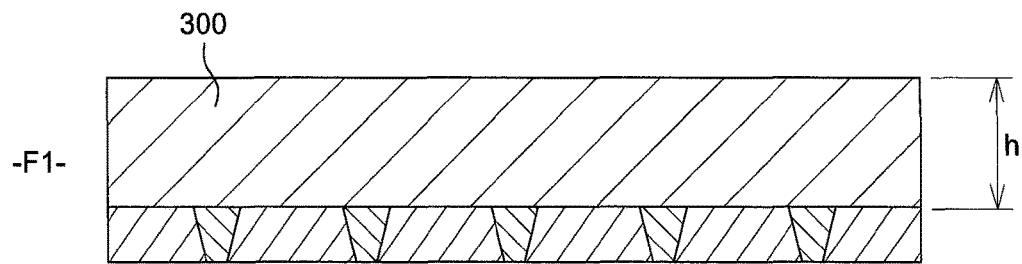
FIGS. 4A to 4G represent steps F1 to F7 of a method for manufacturing a resistive device according to the invention.

Step F1 of FIG. 4A consists in depositing an electrically conductive layer 300 of thickness h on the substrate 100. This layer 300 is intended to form the conductive pillars, after having been etched.

The thickness h of the layer 300 is advantageously greater than the cumulated thickness of the storage elements 120 and covering elements 130 enabling electrical contact to be made above the memory point (cf. FIG. 1). Thus, the material excess 160 between the pillars 110 is situated below the storage element 120. The thickness h is preferably comprised between 4 nm and 400 nm. For example, in MRAM based on magnetic tunnel junctions, the tunnel junction has a thickness of 10 nm to 30 nm and the covering material may have a thickness of 100 nm. In this case, the thickness h is significantly greater than 130 nm, and preferably greater than 180 nm.

Besides, the electrical conductivity of the material of the layer 300 is such that, once etched in mesa shape, the electrical resistance of each pillar is low, typically less than the maximum resistance of the storage element or memory point. The effect of parasitic series resistance, which reduces relative signal variation at the moment of reading the state of the memory point (low or high resistance), is thus minimised.

As an example, the memory point is formed by a magnetic tunnel junction, which may be characterised from an electrical viewpoint by the product "Resistance×Area" or "RA". The product RA is a function of the thickness of the tunnel barrier (for example, an insulating layer made of MgO) and the energy height of this barrier. Besides, by making the approximation that the section A of a pillar is uniform over its entire height h, the electrical resistance $R_t$ of the pillar is written:

$$R_t = \frac{\rho \cdot h}{A}$$

where $\rho$ is the electrical resistivity of the conductive layer 300. A pillar resistance $R_t$ much lower than that of the storage element constituting the memory point is then equivalent to the relation $\rho \cdot h \ll RA$, i.e. $\rho \ll RA/h$. The tunnel junctions used in Spin Transfer Torque MRAM (STT-MRAM) typically have RA values of the order of 10 $\Omega \cdot \mu m^2$. With a thickness h of around 50 nm, this implies the following condition on the electrical resistivity of the layer 300: $\rho \ll 2.10^4$ $\mu\Omega \cdot cm$.

The material of the conductive layer 300 may be selected from tantalum (Ta), tungsten (W), aluminium (Al), titanium (Ti), titanium nitride (TiN) and polycrystalline silicon (poly- Si), highly doped (concentration of dopants for example greater than $5.10^{18}$ cm$^{-3}$ for doping with phosphorous). All these materials meet the above resistivity condition.

According to an alternative embodiment, the conductive layer 300 may be replaced by a stack of several conductive layers having characteristics similar to those described previously, notably from the electrical resistivity viewpoint. An advantageous example of stack is described hereafter, in relation with FIG. 4D.

Figure 4B:
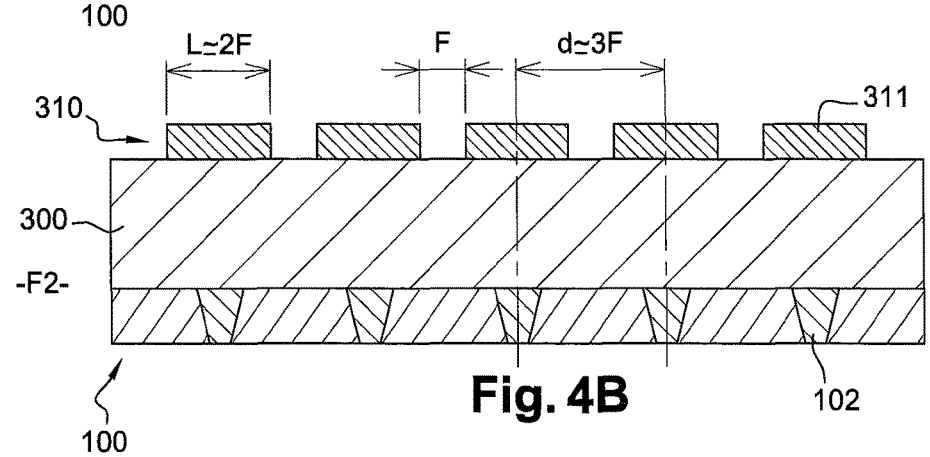
Figure 4C:
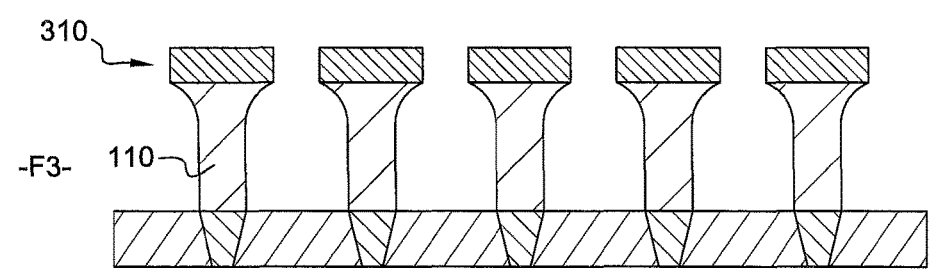

At step F2 of FIG. 4B, an etching mask 310 is formed on the conductive layer 300. Conventionally, the etching mask 310 may be comprised of a photosensitive resin, structured by lithography, or of a material more resistant to etching than the photosensitive resin—in this case, the expression "hard mask" is used. The hard mask is, for example, silicon oxide (SiO$_2$), silicon nitride (Si$_3$N$_4$), silicon oxynitride (SiON) or amorphous carbon.

The solid parts of the mask 310 constitute patterns 311 situated directly in line with the conductive vias 102 (or conductive lines) of the substrate 100 and have the shape of the storage elements that it is sought to produce. Advantageously, each pattern 311 is centred with respect to the underlying conductive via 102 and has dimensions greater than those of the via, such that the pillar formed later covers it entirely. For example, the patterns 311 may have a width L approaching 2F (FIG. 4B). Thus, when the vias 102 are periodically spaced apart by a distance equal to 3F, the edge to edge distance of adjacent patterns 311 is of the order of F. The shape of the patterns 311 is, preferably, round for reasons of homogeneity of the electrical properties over the whole periphery of the pillars and to facilitate the production of the device at the most advanced technological nodes (sub-20 nm). Nevertheless, other shapes may be envisaged, notably square, elliptical and rectangular.

In F3 (FIG. 4C), the conductive layer 300 is etched through the mask 310. The etching technique used during this step F3 is, preferably, reactive plasma etching. Indeed, this makes it possible (in the case of metal or polysilicon of the layer 300) to obtain volatile etching residues which could be eliminated easily, by pumping outside of the etching reactor. The etching conditions are here determined such as to obtain conductive pillars 110 with overhanging sides, for example according to a notch (FIG. 1) or arc of circle (FIG. 2) profile. A highly isotropic etching should be avoided to prevent etching under the patterns of the mask 310, which would reduce the dimensions of the upper face of the pillars (and thus of the storage elements).

All the aforementioned materials may be etched by a reactive plasma based on fluorine (except aluminium) or chlorine (including aluminium), or even bromine. The need to produce set-back sides requires an etching chemistry that gives rise to spontaneous reactions between the material and the etching gas. Gases containing chlorine, such as HCl, Cl$_2$ and BCl$_3$, or fluorine such as SF$_6$, NF$_3$, CF$_4$ will thus be chosen preferentially. It is also possible to use mixtures of gases based on chlorine and fluorine, or mixtures of gases based on chlorine and bromine (for example, HBr is a source of bromine)

To create an arc of circle or "bowing" profile, while avoiding over-etching under the patterns 311 of the mask 310, the reactive etching conditions could be chosen as follows:

the power of the radiofrequency electromagnetic field that generates the plasma is advantageously comprised between 150 W and 500 W, in order to limit the formation of chlorine based radicals;

the polarisation voltage applied to the substrate-holder is, preferably, comprised between 15 V and 1 kV, and advantageously less than 200 V.

These parameters may be adjusted, notably during etching, to control the curvature of the arc. For example, an increase in the RF power makes it possible to increase the concentration of radicals and thus to increase the curvature. An increase in the polarisation power tends to reduce the chemical component of the etching and thus to reduce the amplitude of the bowing. The addition of a diluting gas (Ar, Xe, He, N$_2$, etc.), to reduce the concentration of chlorine in the gas phase, or the addition of a passivating gas, tends to make the plasma less reactive and thus to reduce the spontaneous etching reactions that create the curvature of the sides.

To create a notched profile, a method of etching in two or three steps may be used. During the first step, the upper portion of the layer 300 (typically over 50% of its thickness) is etched in an anisotropic manner to obtain vertical sides. These vertical sides are obtained thanks to the progressive formation of a passivation layer on the walls of the etched patterns, this passivation layer then preventing lateral etching. During the latter step, an isotropic etching is carried out to etch the remaining portion of the layer 300, vertically in the direction of the substrate 100, but also laterally. The upper part of the layer 300 is protected by the passivation layer formed previously during the first etching step. Advantageously, an intermediate step of oxidation is carried out to reinforce the passivation layer.

As an example, a notched pillar made of doped polysilicon may be obtained thanks to an etching by inductively coupled plasma based on HBr/Cl$_2$/O$_2$ (110 sccm/70 sccm/2 sccm) with an ion energy comprised between 70 eV and 80 eV, followed by an etching by a plasma based on Cl$_2$ and SF$_6$ (60 sccm/3 sccm) with an ion energy of the same order of magnitude. In the case of a conductive TiN layer 300, the first etching step may be carried out with an inductively coupled plasma based on HBr/Cl$_2$ (100 sccm/50 sccm), followed by an intermediate step of etching by inductive plasma based on O$_2$ to oxidise the sides, and finally an etching by inductive plasma based on Cl$_2$ (potentially preceded by an identical plasma with high energy ions (≥50 eV) to remove titanium oxide from the etching front).

After having obtained the pillars 110 in the desired shape, the etching mask 310 may be eliminated, preferentially by wet process (for example in a hydrofluoric acid solution).

An alternative to the formation of notched pillars is to employ two superimposed layers of different materials, instead of a single conductive layer 300. The material of the upper layer is then etched in an anisotropic manner, whereas the material of the lower layer is etched in an isotropic manner, without modifying the profile of the upper layer. The following stacks of layers may be cited in a non-exhaustive manner (upper layer/lower layer): doped Si/Al; Al/doped Si, doped Si/TiN, TiN/Al, TiN/W, Al/W, Ru/TiN, Ru/Ti, Ru/Ta, Ru/TaN and Ru/doped Si.

For example, an Al/W stack may be etched with an inductively coupled plasma based on BCl$_3$/Cl$_2$ for aluminium then with an inductively coupled plasma based on SF$_6$ for tungsten. In the case of a Si/TiN stack, it is possible to etch the silicon with an inductively coupled plasma based on HBr/Cl$_2$/O$_2$ then to etch the titanium nitride with an inductively coupled plasma based on chlorine gas (Cl$_2$). The ruthenium of a Ru/Si stack may be etched by an inductive plasma based on oxygen and chlorine gas or hydrogen chloride (HCl). A dilution gas such as Ar, H$_2$, N$_2$ or He may potentially be added to the gas phase of the plasma. The RF power injected into the source is preferably comprised between 150 W and 1500 W and the polarisation power may vary between 20 W and 300 W, preferentially between 20 W and 50 W, in order not to consume too much the hard mask and the underlying layer of doped silicon at the end of the etching of the ruthenium. The silicon layer may then be etched using an inductive plasma based on $SF_6$ or $NF_3$, potentially diluted by argon or helium.

Figure 4D:
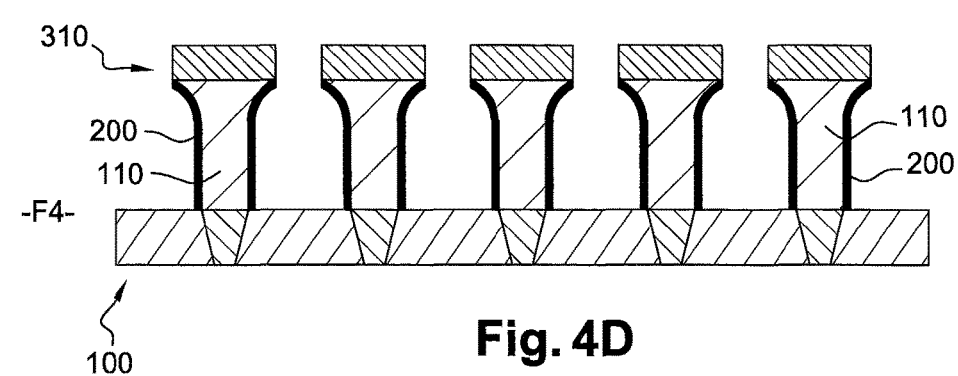

In a preferential embodiment represented by FIG. 4D, the method further comprises a step F4 of forming the insulating layer 200 on the sides of the pillars 110. As it has been described previously, this step is recommended in order to avoid short-circuits between the conductive pillars 110, while limiting the constraints on the dimensions of the pillars and the choice of the dielectric material separating the pillars.

The insulating layer 200 may be obtained in different ways. A first technique consists in forming, against the lateral walls of the pillars 110, dielectric spacers identical or similar to those used in the gate structures of MOS transistors. These spacers are, preferably, formed by ALD (Atomic Layer Deposition). This technique of the microelectronics industry has the advantage of being able to produce conforming depositions, even here on bowed or notch shaped sides. Possible materials are for example $Si_3N_4$, $HfO_2$, $ZrO_2$ or instead $Al_2O_3$.

After deposition of the spacers, the thickness of which may be comprised between 2 nm and 5 nm, an etching step makes it possible to eliminate the material of the spacer at the tops of the pillars 110. Selective etching methods with respect to the material constituting the pillars 110 will preferentially be chosen. It is indeed advisable to minimise damaging their upper face, which will receive a storage element of variable electrical resistance. It is also possible to use a sacrificial material (such as $SiO_2$ or $Si_3N_4$) of which the chemical nature is different to that of the spacer, to protect this surface during etching of the spacer. The hard mask 310 may furthermore play this protective role, in which case it is only removed after having formed the insulating layer 200, and not before.

According to an alternative embodiment, the insulating layer 200 is obtained by oxidation or nitridation of the material that constitutes the pillars 110. In other words, it is possible to make the sides of the pillars insulating from the electrical viewpoint by exposing them to oxygen or nitrogen. A plasma of oxygen or nitrogen may be used to make this oxidation or nitridation more efficient. With the same aim, the substrate may be heated between 20° C. and 450° C.

During this oxidation/nitridation step, the upper face of the pillars 110 is also affected if it is not protected. Thus, to avoid the formation of an insulating material on this upper face, which would lead to problems of reading/writing of the memory point, it is possible as previously to conserve the etching mask 310 during the oxidation/nitridation step and to only remove it after, or to deposit another so-called sacrificial protective material, such as a silicon nitride (SiN, $Si_3N_4$, SiOCN, SiNH) or a silicon oxide ($SiO_2$). The protective material is later removed to make the upper face of the pillars 110 conductive once again. Of course, the removal method is chosen such that it does not affect the insulating layer 200 that has been formed on the sides of the pillars 110. For example, in the case of tantalum nitrided on the sides, a sacrificial layer made of $SiO_2$ on the upper face may be eliminated by a hydrofluoric acid solution.

An alternative is the use of a stack of several sub-layers instead of a single layer 300. As specified at step F1, the layer 300 may be replaced by two materials, preferentially two metals, having different properties. Two specific cases arise:

the so-called protective upper material is insensitive to oxidation or to nitridation—it is for example a noble metal—and the lower material that forms the pillars 110 is capable of forming an oxide or a nitride (Ta, W, Al, Ti, TiN, Si, etc.). In this way, the upper material will be conductive whereas the sides of the lower material will be insulating. The etching of the noble metal, at step F3, may require another etching technique than that used for the material of the pillars 110, for example ion beam etching (IBE).

the lower and upper materials are both capable of forming an oxide or a nitride, but the latter have different electrical behaviour: the oxide/nitride of the upper material is conductive and the oxide/nitride of the lower material is insulating. As an example, it is possible to use as upper material ruthenium (Ru) or chromium (Cr) of which the oxides are conductive, or titanium (Ti) of which the nitride is conductive, in combination with Ti, TiN, Ta, Si, Al or W of which the oxide is insulating, or with Si or Ta of which the nitride is insulating.

Of course, when the technique of spacers is employed to form the insulating layer 200, it is not necessary to have to resort to a protective layer made of chromium, ruthenium or noble metal.

Figure 4E:
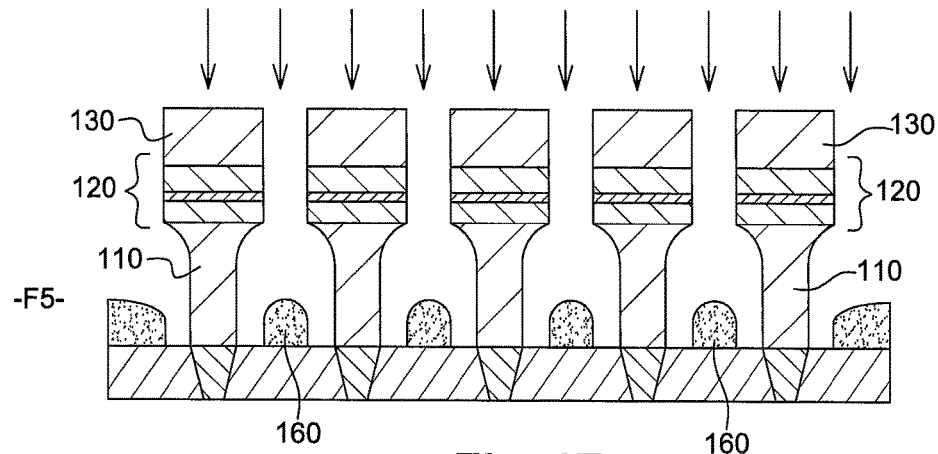

FIG. 4E schematically represents a step F5 in which is deposited, firstly, the resistive material of the storage elements at the tops of the pillars 110 and, secondly, the material of the covering elements 130 enabling electrical contact to be made.

Cathode sputtering is advantageously used at the deposition step F5. This technique has a certain directivity making it possible to direct the deposition of resistive material towards the pillars 110, notably to their top. Nevertheless, resistive material and covering material are also deposited at the bottom of the trenches situated between the pillars 110, or even on a part of the sides of the pillars along the incidence of deposition and the angular dispersion of the flux of atoms from the sputtered target, then forming residual deposits 160. At normal incidence with respect to the surface of the substrate (case represented in FIG. 4E), these residual deposits 160 are located around the centre of the trenches. The more overhanging the sides of the pillars 110, the less the deposits 160 spread out near to the base of the sides. At oblique incidence (case not represented), the depositions 160 may be situated on a single and same side of the pillars 110, or even on all the sides of the pillars if the substrate is rotationally driven during the deposition.

The formation of set-back sides thus prevents the simultaneous deposition of resistive material on two sides facing each other and belonging to different pillars, which avoids a short-circuit between these two pillars. Preferably, the cathode sputtering is collimated in order to increase the directivity of the deposition and thus to reduce the extent of residual deposits 160 at the bottom of the trenches. The deposits 160 may be left as such. Thanks to the electrical discontinuity on the sides of the pillars 110, they do not perturb in a significant manner the operation of the resistive device. In particular, they do not create inter-pad short-circuits.

The formation of the storage elements 120 at the tops of the pillars 110 may comprise the deposition of one or more materials, according to the memory or logic element technology envisaged. For example, to manufacture a MRAM magnetic tunnel junction, a reference layer (e.g. an alloy based on Co, Fe and B), a tunnel is barrier layer (e.g. MgO) and a storage layer (e.g. an alloy based on Co, Fe and B, with concentrations identical or different to those of the reference layer) are successively deposited. The reference layer and the storage layer are (ferro)magnetic, whereas the tunnel barrier layer is non-magnetic. The storage layer may be situated above or below the tunnel barrier, the reference layer being situated on the other side of the tunnel barrier with respect to the storage layer. The tunnel junction is generally covered by the covering element 130. The different layers of the storage elements 120 may be deposited by different techniques and at different incidences (cf. FIGS. 9 to 12). For a PCRAM and a ReRAM (OxRAM, CBRAM), the deposited material is respectively a phase change material and a resistive oxide inserted between conductive electrodes.

In the case of MRAMs, it is generally sought to maximise the surface of the magnetic tunnel junction (for a given memory density), with the aim of improving the thermal stability of the magnetization of the storage layer. Indeed, in MRAMs of sufficiently small dimensions to have macrospin type behaviour (typically below 40 nm lateral dimension), the thermal stability factor of the memory varies in a manner substantially proportional to its surface. The fact of having available flared pillars, with a section at the top larger than at their base, makes it possible to maximise the surface of the magnetic element for a given total surface per memory point and thus to maximise the thermal stability of the magnetization of the storage layer. Care must nevertheless be taken to ensure that pad to pad magnetostatic interactions do not become too strong, on account of the proximity of the edges of neighbouring junctions.

Figure 4F:
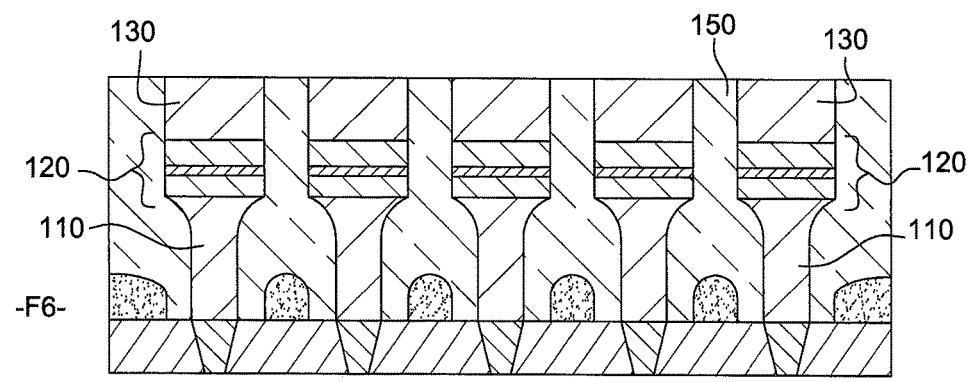

Step F6 represented in FIG. 4F consists in filling, with an electrically insulating material 150, the space between the vertical structures formed by the pillars 110, the storage elements 120 and the superimposed covering elements 130. Various techniques of the microelectronics industry make it possible to fill with dielectric material (generally an oxide) structures with high form factor (type STI, FinFET, "damascene" gate transistor, etc.) and/or with overhanging sides. The gas phase deposition of liquid dielectric films may notably be cited. Liquid dielectric films are similar to a gel having the flow characteristics of a liquid. By exploiting this technique, it is easily possible to fill structures with form factors above 10, even going up to 30.

The liquid dielectric material for filling the inter-pad trenches of FIG. 4F may be selected from $Si_3N_4$, $SiO_2$, $SiO_xC_yH_z$, $SiO_xH_y$, and $SiO_xN_yH_z$. These materials are selected for their electrical resistivity (advantageously $\rho > 0.1$ $\Omega\cdot cm$) in order that leakage currents between memory points are minimised. For example, to form a liquid silicon oxide, the substrate is exposed simultaneously to a gaseous precursor containing silicon and to an oxidising gas. The gases containing the silicon and the oxidising gas are either mixed before their introduction into the reactor or injected separately into the reactor. The silicon containing precursor may be an alkoxysilane, for example $H_x$—Si—$(OR)_y$ where x=0~3, x+y=4 and R designates an alkyl group. Silane ($SiH_4$) and derivatives thereof, such as tetraethoxysilane (TEOS), triethoxysilane (TES), trimethoxysilane (TriMOS), methyltrimethoxysilane (MTMOS), dimethyldimethoxysilane (DMDMOS), diethoxysilane (DES), dimethoxysilane (DMOS), hexamethoxidisilane (HMODS) and triphenylethoxysilane, or instead tetraoxymethylcyclotetrasiloxane (TOMCTS), octamethylcyclotetrasiloxane (OMCTS), methyltriethoxyorthosilicate (MTEOS), tetramethylorthosilicate (TMOS), 1-(triethoxysilyl)-2-(diethoxymethylsilyl)ethane and tri-t-butoxylsilanol are other examples of silicon containing precursors. The oxidising gas may be ozone ($O_3$), hydrogen peroxide ($H_2O_2$), oxygen ($O_2$), water ($H_2O$), methanol, ethanol, isopropanol or a nitric oxide (NO, $N_2O$). The temperature of the substrate and the working pressure in the reactor make it possible to adjust the deposition rates. Generally, the temperature of the substrate is comprised between −30° C. and 100° C. (a low temperature makes it possible to increase the deposition rate). The pressure is for example comprised between 100 mT and atmospheric pressure.

The advantage of this technique compared to other gas phase deposition techniques is the absence of voids or cavities in the layer of dielectric material 150. Nevertheless, the presence of voids in the inter-pad space is not detrimental, as long as a flat, continuous surface is obtained at the end of step F6. The presence of voids between the pads may even bring advantages in certain situations. For example, in the case of PCRAM, these voids may reduce crosstalk phenomena between the pillars, by limiting lateral thermal diffusion. On the other hand, the vertical structures may be more fragile. The techniques of physical vapour deposition (PVD), plasma enhanced chemical vapour deposition (PECVD), atomic layer deposition (ALD) form layers of uniform thickness and are thus capable of forming voids in structures with high form factor, all the more when they have set-back sides (because they rapidly lead to a pinching at the top of the structure).

An alternative to gas phase methods is deposition by centrifugation. In this case, a sol-gel precursor is diluted in a solvent and deposited in liquid form on the rotating substrate. Under the effect of centrifugal force, the liquid spreads out in a uniform manner on the surface of the substrate. The precursors polymerise and the solvent evaporates to form a dielectric material called "Spin On Glass" (SOG). The thickness of the deposited layer is controlled by the viscosity of the material and the speed of rotation of the substrate. The materials thus produced may be silicas or silicones of poly-methylsiloxane, poly-methylsilsesquioxane, poly-oxycarbosilane, poly-dimethylsiloxane type. They may also be polymers, such as planarization resins, for example that sold by the "Honeywell" company under the denomination "ACCUFLO".

Advantageously, a barrier layer (e.g. $Si_3N_4$) may be deposited on the vertical structures prior to filling with dielectric material 150, in order to avoid contact of these structures with the oxidising environment. The barrier layer preferably has a thickness comprised between 3 nm and 5 nm. It makes it possible to block the diffusion of oxidising species, without the dimensions of the patterns being too impacted. An ALD or PEALD type method is preferred to guarantee total coverage of the surfaces, including the set-back sides.

Partial filling of the trenches may be envisaged, in so far as electrical insulation is assured even in the presence of voids. This makes it possible to reduce inter-pad conductance and thus minimise the risks of crosstalk between pads.

With all the aforementioned deposition techniques, it is difficult to obtain directly a flat surface at the level of the upper face of the covering elements 130. Consequently, it is preferable to cover entirely the vertical structures with the dielectric material and then to eliminate excess material. To do so, it is possible to use a chemical mechanical planarization method or a plasma etching of "etch back" type (typically $CF_4$, $CHF_3$, $CH_2F_2$, $C_4F_8$ or $C_4F_6$) when the deposition of the dielectric material already tends to produce a flat layer. Conventionally, the polishing or plasma etching method is stopped when the covering material 130 is reached. This may be done by controlling the polishing/etching conditions, knowing the rate of etching and the thickness of the material to etch, or by detecting the end of etching during the method (for example by reflectometry or optical emission spectroscopy).

Figure 4G:
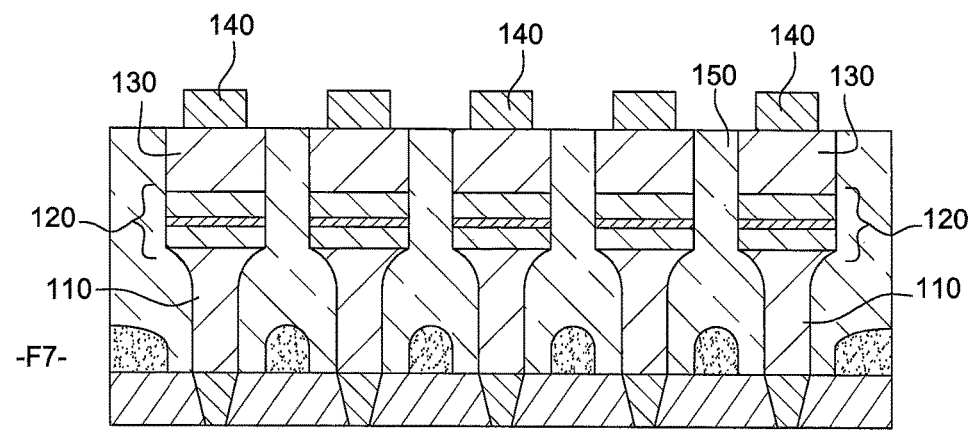

Finally, at step F7 of FIG. 4G, a contact or metalisation level is formed on the flat surface obtained at the end of step F6. Each electrical contact 140 is placed at the top of a vertical structure on the covering element 130, and preferably at the centre thereof. The contacts 140 are obtained conventionally thanks to a so-called "partitioning" method (deposition of a layer of conductive material, structuring by photolithography then etching), by a "damascene" type method or by a lift-off method.

Figure 5:
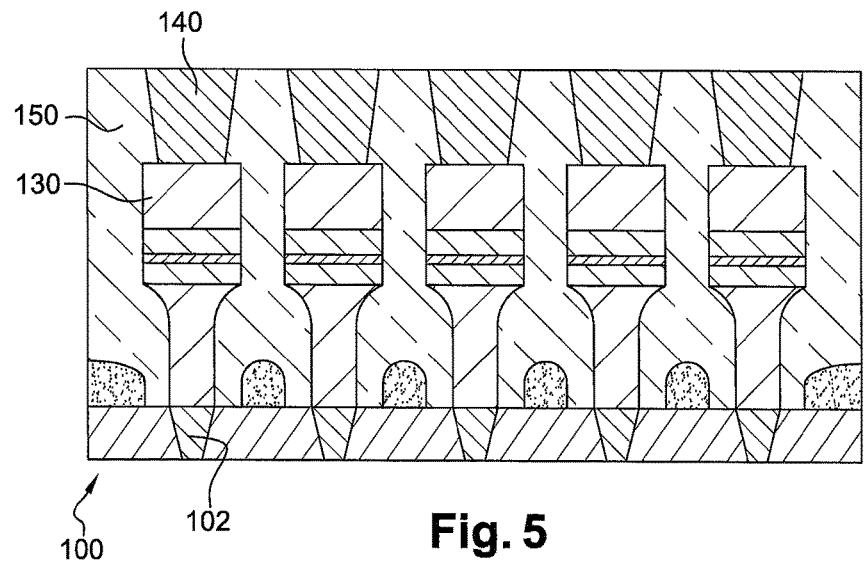
FIG. 5 illustrates an alternative embodiment of steps F6 and F7.

According to an alternative embodiment of steps F6 and F7 represented by FIG. 5, the dielectric filling material 150 is deposited on the substrate 100 until entirely covering the vertical structures. Then, contacts 140 are formed according to a "damascene" approach within the material 150 itself. Cavities are opened in the material 150, which emerge on the covering elements 130, then these cavities are filled with metal (typically copper or aluminium) and finally excess metal is eliminated by CMP. Thus, in this alternative embodiment, the electrical contacts 140 are comprised in the filling layer made of dielectric material 150, and not in an additional dielectric layer deposited on the filling layer. The step of planarization (by CMP or plasma etching), described in relation with FIG. 4F and enabling the filling layer 150 to be flush at the level of the covering elements 130, may then be eliminated.

It may be noted in the sectional view of FIG. 5 that, when they are produced according to the "damascene" method, the electrical contacts 140 and the conductive vias 102 of the substrate 100 also have a flared shape, with a section at the base smaller than at their top. By their very shape, the conductive vias of damascene type could thus serve as support to the variable resistance storage elements. Thus, in a third embodiment of the resistive device, the flared conductive pillars are constituted of electrical interconnection vias of damascene type.

Figure 6:
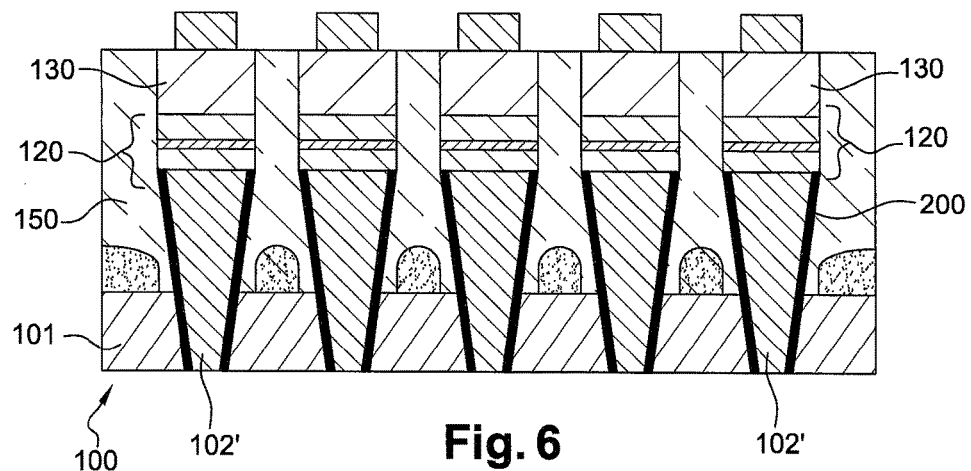
FIG. 6 represents an example of resistive device wherein the flared pillars are formed by interconnection structures of "damascene" type, according to a third embodiment of the invention.

In FIG. 6, the pillars are advantageously formed by the upper part of conductive vias 102' belonging to the final interconnection level of the substrate 100 (before the memory points). In other words, the conductive vias 102' are extended outside of the dielectric layer 101 and serve as support to the deposition of the storage elements 120 and the covering elements 130, before being surrounded by the dielectric filling material 150.

Figure 7A:
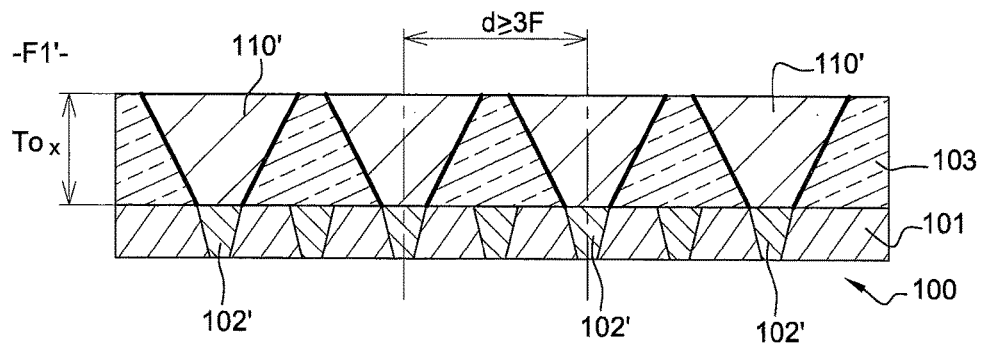
FIGS. 7A to 7C represent steps F1' to F3' of a method for manufacturing the resistive device according to the third embodiment of the invention.
Figure 7B:
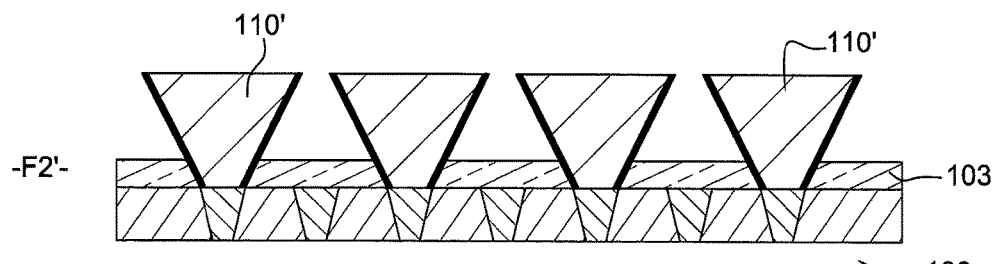
Figure 7C:
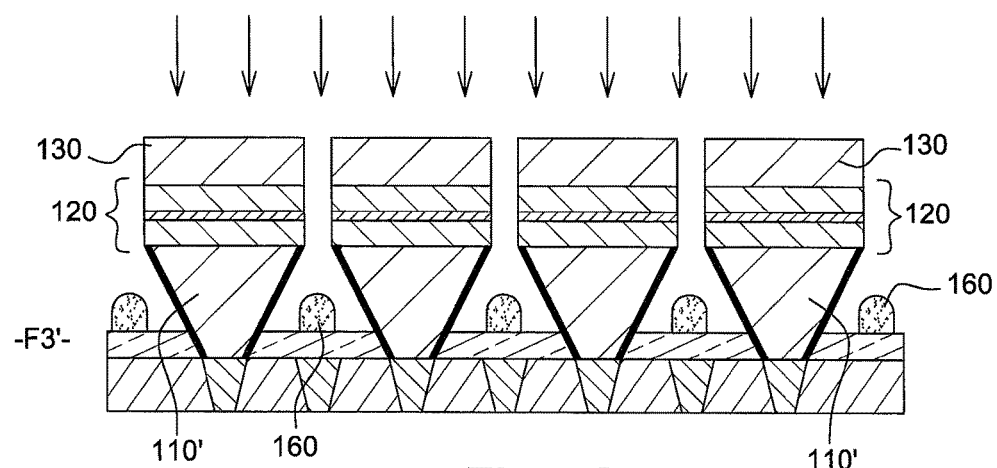

Alternatively, the conductive pillars may be formed by interconnection vias of damascene type distinct from the interconnection vias 102 of the dielectric layer 101. FIGS. 7A to 7C represent steps F1' to F3' of a method making it possible to manufacture this latter alternative embodiment of the resistive device.

At step F1' of FIG. 7A, vertical interconnection structures 110' of damascene type are formed in an additional dielectric layer 103 arranged on the substrate 100, and more particularly on the dielectric layer 101 containing the interconnection vias 102. Firstly, the dielectric layer 103 of thickness $t_{ox}$ is deposited on the substrate 100. The thickness $t_{ox}$ is, preferably, comprised between 4 nm and 400 nm. Then, cavities are etched in the dielectric layer 103 down to the substrate 100, preferably by a plasma etching method. Cavities with slightly oblique sides (this profile facilitates the metallisation step) may be obtained by a plasma based on fluorocarbon gas ($C_xH_yF_z$) potentially diluted in $N_2$ and/or Ar. Fluorocarbon layers are then formed on the sides of the etched patterns. Finally, a conductive material is deposited on the dielectric layer in such a way as to fill the cavities entirely, and excess conductive material outside of the cavities is removed by chemical mechanical polishing (CMP).

The interconnection structures 110' may be obtained by a "single damascene" or "dual damascene" method. In the "single damascene" method, a single pattern (e.g. via or line) is formed then filled with metal in the dielectric layer 103, whereas the "dual damascene" method simultaneously fills two superimposed patterns, for example an interconnection via and an interconnection line covering the via.

The interconnection structures 110' are situated at the locations where a memory point is desired, in contact with the interconnection vias 102 of the substrate 100. Together, they conduct electric current between the memory points and the reading circuit situated in the substrate 100. The distance between two consecutive interconnection structures 110' is, preferably, equal or greater than 3F, where F is the smallest dimension that can be attained with photolithography.

Preferably, the conductive material of the interconnection structures 110' is selected from copper, tantalum, tungsten, titanium nitride and aluminium, or a combination of these materials (for example Cu surrounded by TiN), on account of their low electrical resistivity ($\rho \ll 10^4$ μΩ·cm). The additional dielectric layer 103 may be constituted of a silicon oxide ($SiO_2$, SiOCH), a silicon nitride ($Si_3N_4$, SiCN) or an insulating polymer material (e.g. materials sold by the "Dow Chemical" company under the designation "SILK" and by the "Honeywell" company under the designation "FLARE"). It may also be composed of two different insulating materials, thus forming two sub-layers, for example a lower SiCN sub-layer and an upper $SiO_2$ sub-layer. The lower sub-layer advantageously plays the role of barrier to the diffusion of the metal constituting the interconnection structures 110' (and other interconnection patterns formed simultaneously, of via or line type) to the substrate.

Step F2' of FIG. 7B consists in thinning the dielectric layer 103, such as to free partially the interconnection structures 110'. Pillars of flared shape that stand up vertically on the substrate 100 are then obtained. Their top is free, whereas their base is buried in the dielectric layer 103, which improves their maintaining and assures electrical contact with the underlying vias.

Advantageously, the thickness of material removed at step F2' (Le. the height of the pillars measured from the upper face of the remaining dielectric layer 103 up to the tops) is much greater than the cumulated thickness of the storage and covering elements that will be deposited thereafter, for example 1.2 times the cumulated thickness of the storage and covering elements.

In an alternative embodiment, the dielectric layer 103 is removed entirely. The pillars stand on the substrate 100, even in the absence of the layer 103 (then all of the structure will be consolidated by the dielectric filling material 150).

The removal of the dielectric material 103 is, preferably, carried out by an isotropic etching that is selective with respect to the conductive material of the interconnection structures 110', in order to free the sides of the pillars over the whole etched thickness and not to increase the surface roughness, in particular on their upper face intended to receive a storage element. As an example, in the case of a $SiO_2$ type insulator, the removal step may be carried out by wet process, by means of a solution of hydrofluoric acid or hydrofluoric acid in vapour phase. For a carbon based material, a reactive plasma based on oxygen may be used. The combination of an oxygen plasma and a hydrofluoric acid chemical attack makes it possible to etch a porous material of SiOCH type. Finally, in the case where the additional dielectric layer 103 containing the interconnection structures 110' is composed of two distinct materials, the thinning step F2' may be carried out by totally etching the upper sub-layer, whereas the lower sub-layer serves as stop layer to this etching. The thickness of dielectric material removed may be controlled by the etching time, knowing the rate of etching (except in the case of a selective stop sub-layer, where such a control is not necessary).

FIG. 7C represents step F3' of PVD of the storage elements 120 and the covering elements 130 at the tops of the interconnection structures 110'. Step F3' is identical to step F5 described previously in relation with FIG. 4E, although the pillars have not been obtained in the same way. At the end of step F3', residual deposits 160 are situated on the thinned dielectric layer 130, between the interconnection structures 110'. These residual deposits 160 do not perturb the operation of the device.

Steps F6 and F7 of the manufacturing method of FIGS. 4A to 4G (filling by the dielectric material and formation of electrical contacts), as well as their alternative embodiment represented by FIG. 5, may be carried out at the end of the deposition step F3', according to the same modus operandi.

If it is wished to form pillars in accordance with the exemplary embodiment of FIG. 6, that is to say by reusing the conductive vias 102 rather than by creating an additional interconnection level, only the dielectric layer 101 is used. Step F1' then comprises the formation of conductive vias 102 of damascene type in the dielectric layer 101 and, at step F2', the dielectric layer 101 is thinned to free the conductive pillars. There is thus no additional dielectric layer 103 in this embodiment and the final interconnection level of the substrate 100 before the memory points is dimensioned to form the pillars.

To isolate electrically the sides of the pillars in this third embodiment, a layer made of insulating material ($Si_3N_4$, $HfO_2$, SiOCH, etc.) may be deposited in the cavities during the formation of the interconnection structures of damascene type. This deposition takes place before filling with conductive material. A CVD, PECVD, ALD or PECVD type method is advantageously used, in order that the insulating layer perfectly hugs the lateral walls of the cavities and covers them in a homogeneous manner. This layer, or liner, preferably has a thickness comprised between 2 nm and 5 nm, in order to avoid a too considerable increase in the resistivity of the pillars while correctly insulating their sides. If necessary, the insulating material deposited on the upper face of the dielectric layer 103 could be eliminated during the planarization step taking place after filling by the metal. Finally, to re-establish electrical continuity, the insulating material deposited at the bottom of the cavities may be removed by an ion bombardment sputtering method (typically an argon plasma).

In addition to its electrical insulation function, the liner on the lateral walls of the cavities may serve as barrier layer, by preventing the diffusion of metal into the dielectric material.

At the moment of forming the interconnection structures 110' (step F1'), other interconnection patterns (via or lines) may be formed simultaneously in another portion of the substrate, for example to make contact with the source, drain and gate zones of selection transistors. A layer made of sacrificial material (e.g. SiCN, $Si_3N_4$) is firstly deposited on the substrate after step F1'. Then, it is opened in the portion where it is wished to form memory points. After deposition of the resistive material and the covering material, the sacrificial layer is taken off by isotropic etching, taking with it the materials that cover it (by lift-off). Advantageously, a dielectric barrier is deposited on the interconnection patterns and the memory points, before filling the trenches with dielectric material 150 and forming electrical contacts 140.

Figure 8:
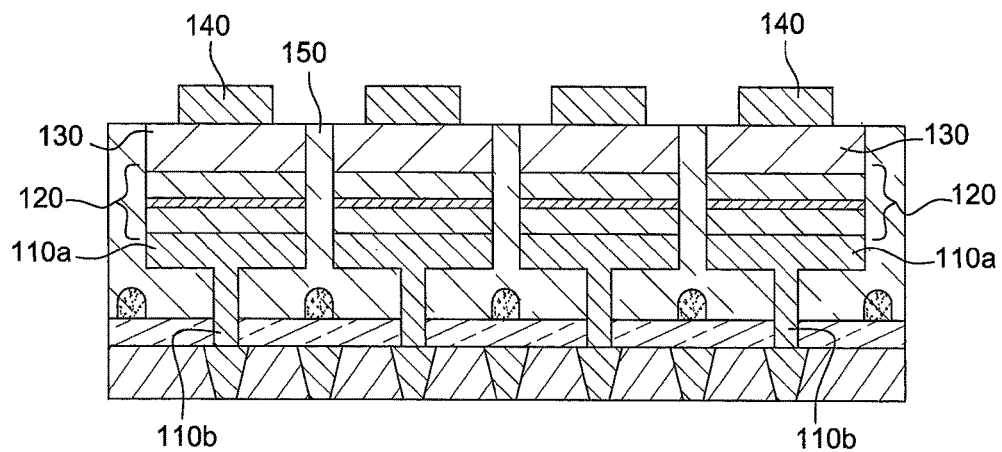
FIG. 8 represents another example of resistive device wherein the flared pillars are of "damascene" type, manufactured thanks to the "dual damascene" method.

FIG. 8 represents the configuration of the interconnection structures 110' when they are formed according to a "dual damascene" method. The structures 110' are in two parts, an upper part 110a and a lower part 110b. The parts 110a and 110b each have a constant section. Nevertheless, the section of the upper part 110a is greater than that of the lower part 110b, which results in a break off. This break off favours the discontinuity of the deposition of resistive material and the covering material at step F3'. The upper part 110a formed by a line may be etched in the dielectric layer before the lower part 110b formed by a via ("Trench First Via Last" approach) or instead after ("Via First Trench Last" approach).

In the cathode sputtering technique used at step F5 (FIG. 4E) to deposit the storage elements at the tops of the pillars 110, a target constituted of the material to deposit is bombarded by a plasma, generally argon based. Unless diaphragms are interposed between this target and the substrate during deposition, the chemical species are emitted from the target with a certain angular distribution. The angle of opening of this distribution depends notably on the mode of sputtering (continuous or radiofrequency), the voltage applied to the target, the pressure of the sputtering gas and the nature of the sputtered material. Typically, this angle of opening measures between $-20°$ to $+20°$ with respect to a direction normal to the target (measured at mid-height). Diaphragms make it possible to increase the directivity of the beam of sputtered species, while limiting the angular opening. The expression "collimated cathode sputtering" is used in this case.

When the cathode sputtering of step F5 is not collimated, the layer deposited at the top of each pillar has a rounded shape at the edges of the pillar, rather than at right angle (cf. FIG. 4E), due to the angular dispersion of the beam of sputtered species. This rounded shape results from a shadow effect that occurs during deposition at the level of each pillar. Here, it is proposed to take advantage of this rounded shape at the edges of the pillars in order to create, in the storage elements, local variations in thickness and/or chemical composition. This makes it possible notably to confine the electric current to the central part of each memory point, far from the edges where the risk of encountering structural defects is higher (but nevertheless lower with respect to plasma etching and IBE methods of the prior art). Thickness and composition gradients are advantageously created by playing on the incidence of deposition by cathode sputtering. Various examples of storage elements implementing this principle are described hereafter.

Figures 9A, 9B, 9C:
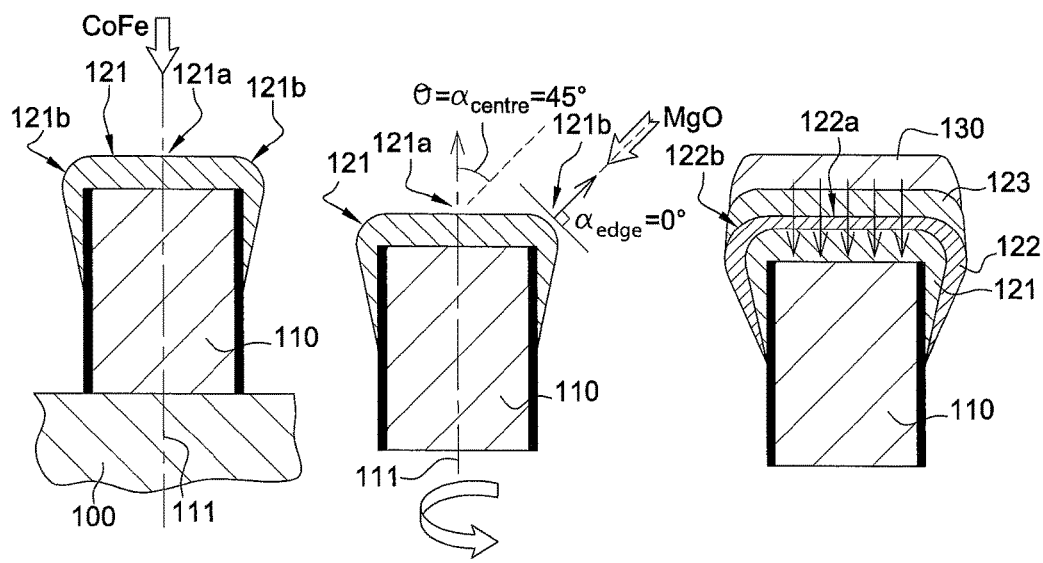
FIGS. 9A to 9C represent the formation of a first example of storage element having a local variation in thickness.

FIGS. 9A to 9C represent in detail the formation of a MRAM magnetic tunnel junction at the top of a pillar 110. The stack of layers that constitutes the magnetic tunnel junction comprises for example a lower electrode containing the reference magnetic layer 121 made of CoFeB alloy, a tunnel barrier layer 122 made of MgO and a magnetic storage layer 123 made of CoFeB alloy. A covering element 130, for example made of tantalum, is added above the stack with a view to making an upper electrical contact.

In FIG. 9A, the lower electrode containing the reference layer 121 made of CoFeB is deposited by non-collimated cathode sputtering at a normal incidence to the plane of the substrate 100, i.e. parallel to the axis of symmetry 111 of the pillar 110 (the latter being oriented perpendicularly to the substrate 100). The layer 121 then comprises a flat portion 121a at the centre of the upper face of the pillar 110 and edges 121b of rounded shape partially covering the sides of the pillar 110.

The deposition of the MgO tunnel barrier layer 122 on the reference layer 121 (FIG. 9B) is then carried out. The deposition of MgO is advantageously carried out by cathode sputtering at oblique incidence according to an angle θ measured with respect to the axis 111 of the pillar 110, for example equal to 45°. The result is that the material is deposited more slowly on the central portion 121a of the layer 121 than on the rounded edge 121b arranged on the same side as the source of MgO (right edge in FIG. 9B). Indeed, in cathode sputtering, the rate of deposition is proportional to the cosine of the angle a between the normal to the surface on which is deposited the flux of material and the direction of propagation of said flux. Yet, the angle a is equal to 45° at the level of the flat portion 121a ($\alpha_{centre}=\theta=45°$), whereas on approaching the rounded edge 121b, the angle a reduces to reach 0° at the middle of the roundness ($\alpha_{edge}=0°$).

During deposition, the substrate that supports the pillar 110 is advantageously rotationally driven. This makes it possible to obtain a symmetrical tunnel barrier layer 122 having a central portion 122a thinner than its edges 122b (because the rate of deposition is slower there), as illustrated in FIG. 9C.

The formation of the tunnel junction ends with the deposition of the storage layer 123 made of CoFeB on the tunnel barrier layer 122, then the covering element 130 made of tantalum is deposited on the storage layer 123. These two depositions are, preferably, carried out by collimated cathode sputtering at a normal incidence, in order to avoid the layers 123 and 130 overflowing onto the sides of the pillar 110 (which could cause a short-circuit of the magnetic tunnel junction).

Thus, a lateral thickness gradient of the MgO tunnel barrier layer 122 may be obtained by playing on the deposition incidence. This gradient is particularly advantageous during the operation of the MRAM. Indeed, when a voltage is applied on either side of the magnetic tunnel junction, the electric current flows through the tunnel barrier layer 122 and preferentially to the centre thereof, that is to say in the portion 122a where its thickness is the lowest (FIG. 9C). Thus, it is possible to reduce the impact of potential edge defects on the electrical and magnetic properties of the memory points and thus to reduce variability from one memory point to another in a MRAM.

Figures 10A, 10B:
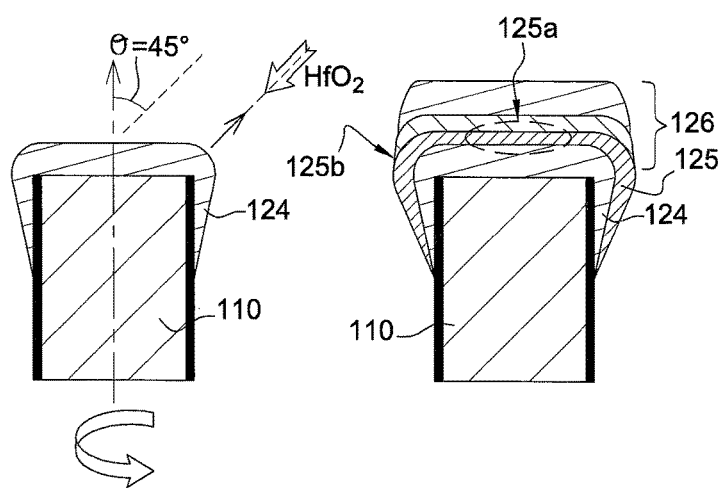
FIGS. 10A and 10B represent the formation of a second example of storage element having a local variation in thickness.

FIGS. 10A and 10B represent another example of obtaining a lateral thickness gradient, this time in an OxRAM type storage element. In this type of memory point, a conductive path is formed in a reversible manner through an oxide, by accumulation of oxygen vacancies. The type of stack comprises a first electrode 124 (for example made of TiN), a layer of oxide 125 (e.g. $HfO_2$) and a second electrode 126 (e.g. Ti/TiN).

Once again, in order to minimise variability from one memory point to another, it is advantageous to conform the memory point in such a way that the conductive path forms in the central part of the memory point, far from the edges, which are capable of containing defects. This may be obtained by sputtering the oxide $HfO_2$ at an oblique incidence (for example 45°) while turning the substrate on itself, as illustrated in FIG. 10A. Indeed, this mode of deposition makes it possible to obtain an oxide layer 125 having a lower thickness in its central portion 125a than on its edges 125b (FIG. 10B). The electric current is then concentrated at the centre of the storage element, like in the tunnel barrier layer of the preceding example.

Rather than obtaining a local variation in thickness, it could be sought to modify locally the composition of an alloy entering into the manufacture of the storage elements.

In FIGS. 11A and 11B, a magnetic tunnel junction for spin torque transfer memory STT-MRAM is taken as example. In this type of memory, it is interesting to use the alloy CoFeV as storage electrode, because vanadium (V) is known to reduce the Gilbert damping coefficient. This makes it possible to reduce the writing current by spin transfer (the writing current is proportional to this damping coefficient).

Furthermore, it is known that the incorporation of vanadium in CoFe alloy has the effect of reducing the magnetic moment of the iron. The magnetic properties of the electrode could thus be modulated by varying the vanadium content in the CoFeV alloy.

To achieve such a result, the electrode may be deposited by simultaneous cathode sputtering of an CoFe alloy at normal incidence (non-collimated) and of vanadium at oblique incidence (for example 45°), while turning the substrate on itself (FIG. 11A). This results in a layer 127 of CoFeV alloy of which the vanadium content is lower in its central portion 127a than on its edges 127b (FIG. 11B), thanks to a slower rate of deposition of vanadium at the centre than on the edges. The electrode 127 is then formed of a CoFeV alloy of a first composition on the central part of the pillar 110 (for example $Co_{60}Fe_{20}V_{20}$) and of a CoFeV alloy of a second composition at its periphery, having a higher concentration of vanadium (for example $Co_{40}Fe_{13}V_{47}$). The latter alloy may furthermore become non-magnetic if it is very rich in vanadium, which avoids once again being sensitive to pillar edge defects, such as local variations in magnetic anisotropy.

Finally, the example represented by FIGS. 12A and 12B concerns a PCRAM storage element. In a PCRAM, the storage material is a phase change material, for example of GeSbTe type (different compositions of this alloy are possible), having a stable structure at ambient temperature either in an amorphous state, or in a crystallised state. These two states have different electrical resistances, the amorphous state being much more resistive than the crystallised state (sometimes 1000 times more resistive). The reading is carried out by measuring the level of resistance of the phase change material, by means of an electric current flowing there through. The writing of the memory point takes place by applying a current pulse of form suited to the state that it is wished to write. A narrow pulse followed by a rapid quenching from the liquefaction temperature of the material leads to the amorphous state. A long pulse at a temperature just below the crystallisation temperature followed by a slower cooling leads to the crystalline state. Furthermore, it is known that by increasing the concentration of germanium (Ge) in the alloy, the crystallisation temperature and the electrical resistivity in the crystallised state increase.

A layer of phase change material having two different compositions of GeSbTe alloy may be obtained by directing to the top of the pillar 110 a flux of SbTe (non-collimated) at a normal incidence and a flux of Ge at an oblique incidence (e.g. 45°) simultaneously, as illustrated in FIG. 12A. This mode of deposition forms a GeSbTe layer 128 of which the central portion 128a is less rich in germanium than its edges 128b (FIG. 12B). The alloy situated at the edges 128b having a higher crystallisation temperature than that at the centre, the active part of the memory point is limited to the central portion 128a of the memory layer 128. As previously, this makes it possible to make uniform the electrical properties between different memory points.

Of course, other fluxes than those described previously may be used. For example, a variable germanium content may be obtained with a flux at normal incidence of $Sb_2Te_3$ and a flux at oblique incidence of GeTe. Furthermore, by increasing the antimony (Sb) content in the GeSbTe alloy, the writing rate of the PCRAM memory point increases and the amorphous-crystalline transition temperature decreases. By depositing antimony at normal incidence and GeTe alloy at oblique incidence, it is possible to obtain an alloy richer in Sb at the centre of the pillar than at its edge. Thus, the amorphous/crystallised transition takes place preferentially at the centre of the pad.

More generally, a lateral thickness gradient may be obtained by cathode sputtering of a chemical species at an oblique incidence, whereas a lateral chemical composition gradient may be obtained by simultaneous cathode sputtering of at least two different chemical species at different incidences, one being oblique and the other normal. Preferably, the inclination angle θ of the oblique flux is comprised between 20° and 70°.

It will be noted furthermore that obtaining a thickness and/or chemical composition gradient is independent of the shape of the pillars and the manner in which they have been obtained. These modes of deposition of the storage element are in fact applicable whatever the profile of the sides: sides going in (i.e. overhanging, notched or arced), straight or even going out. In addition, it is not necessary to turn the substrate on itself if it is not sought to obtain a symmetrical thickness and/or composition gradient, i.e. on all the edges of the pillars.

The use of flared pillars as support to the deposition of the resistive material widens the field of applications of non-volatile memories. Indeed, apart from the fact that the manufacture of an OxRAM, CBRAM, PCRAM or MRAM is facilitated, it is henceforth possible to form a hybrid memory, i.e. which comprises two matrices of memory points of different technologies on a same substrate.

As an example, it is possible to associate with a MRAM matrix of magnetic memory points with a PCRAM matrix of memory points confined in volume. Confined PCRAM are a category of phase change memories in which the active part of the phase change material is situated on a lateral wall of a spacer made of dielectric material. Such a structure makes it possible to optimise the electrical consumption of the memory, by reducing notably the writing current of the insulating state ("reset" current). Confined PCRAM have been the subject of numerous studies, notably the article ["A Scalable Volume-Confined Phase Change Memory using Physical Vapour Deposition", S. C. Lai, Symposium of VLSI Technology, 2013], but they have never been associated with another type of memory until now.

The advantage of MRAM/PCRAM hybrid memories is that, in a single component, a complete non-volatile memory solution is obtained, which combines the strengths of each type of memory, here the endurance and the operating speed of MRAM on the one hand and the low consumption and high integration density of confined PCRAM on the other hand. Such hybrid memories make it possible to replace volatile memories in numerous situations.

To manufacture a MRAM/PCRAM hybrid memory, a first portion of the substrate containing flared conductive pillars is dedicated to the formation of magnetic memory points, according to the method described in relation with FIGS. 4A to 4G. PCRAM memory points are for their part formed in a second portion of the substrate, which also contains conductive flared pillars. In other words, the conductive pillars are distributed between these first and second portions of the substrate. The conductive pillars of the second portion are covered with a phase change material, whereas magnetic tunnel junctions are formed at the tops of the pillars of the first portion.

A method for manufacturing the confined PCRAM matrix will now be described below with reference to FIGS. 13A to 13F. This method and that of FIGS. 4A to 4G share a large number of characteristics (common elements bear the same reference signs). Hence, they are mutually compatible and make it possible to integrate the two types of memory on a same substrate.

The information given previously regarding any of the steps of FIGS. 4A and 4G, notably their modus operandi, is applicable from the moment that one of these steps is taken up in the method for manufacturing the confined PCRAM matrix, even partially. Emphasis will thus be made below to underline the differences between the two methods, rather than repeating this information.

Figure 13A:
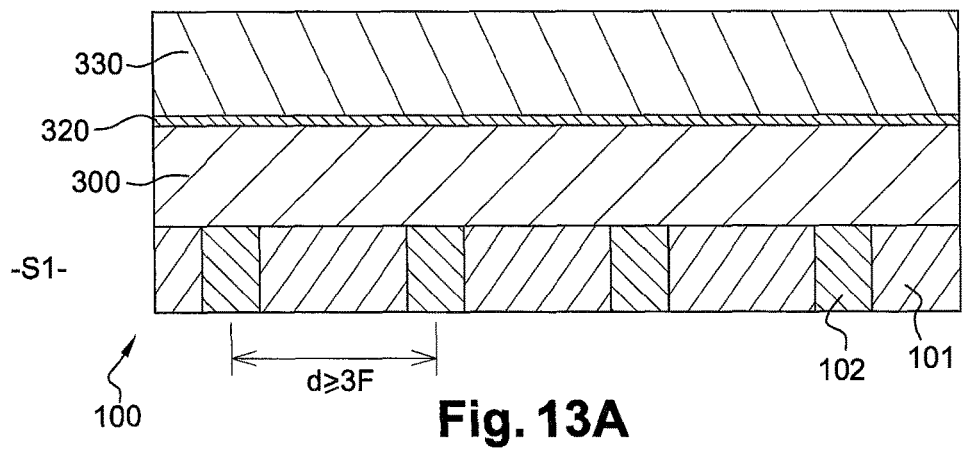
FIGS. 13A to 13F represent steps S1 to S6 of a method for manufacturing a confined hybrid MRAM/PCRAM resistive device according to the invention.

At step S1 of FIG. 13A, the first conductive layer 300 intended to form conductive pillars is deposited on the substrate 100 of FIG. 3. Advantageously, the conductive layer 300 is covered with a protective layer 320 preventing the formation of an insulating oxide or nitride, for example ruthenium (in the case of an oxide). Finally, a dielectric layer 330 is deposited on the protective layer 320.

Figure 13B:
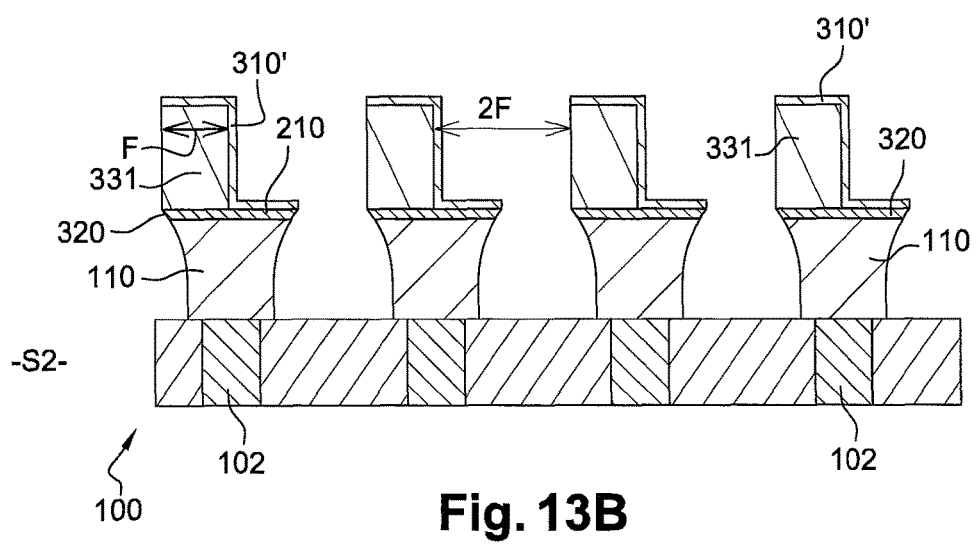

During step S2 represented by FIG. 13B, spacer pads 331 are formed in the dielectric layer 330, by photolithography and etching. The etching is carried out for example by reactive plasma etching with stoppage on the underlying ruthenium layer 320. It may be highly anisotropic, in which case the spacers 331 have lateral walls perpendicular to the plane of the substrate. The dielectric material of the spacers 331 is advantageously a nitride (e.g. SiN), to avoid it oxidising the phase change material that will later cover these pads. Preferably, the spacer pads 331 have a width equal to F and are separated by trenches of width equal to 2F. They are thus spaced periodically, like the conductive vias 102 of the substrate 100 (their period being equal to 3F).

During the same step S2 (FIG. 13B), an etching mask 310' (hard mask or made of resin) is formed on the spacer pads 331 and a part of the ruthenium protective layer 320. The mask 310' fulfils the same role as the mask 310 of FIG. 4B, except that here it hugs the surface topography created by etching of the dielectric layer 330. The solid parts of the mask 310', situated directly in line with the conductive vias 102, are found lying astride the protective layer 320 and the spacer pads 331. Finally, the layers 300 and 320 are etched through the mask 310' to form the conductive pillars 110. The etching conditions are selected to as to form overhanging sides, as described previously in relation with FIG. 4C.

At the end of step S2, flared pillars 110 are then obtained, of which the upper face is covered by the ruthenium protective layer 320, itself being partially covered by the spacer pads 331. Preferably, the spacers 331 are all situated on a same side of the pillars 110 (for example on the left side in FIG. 13B) and do not go beyond the edge of the pillars 110.

Figure 13C:
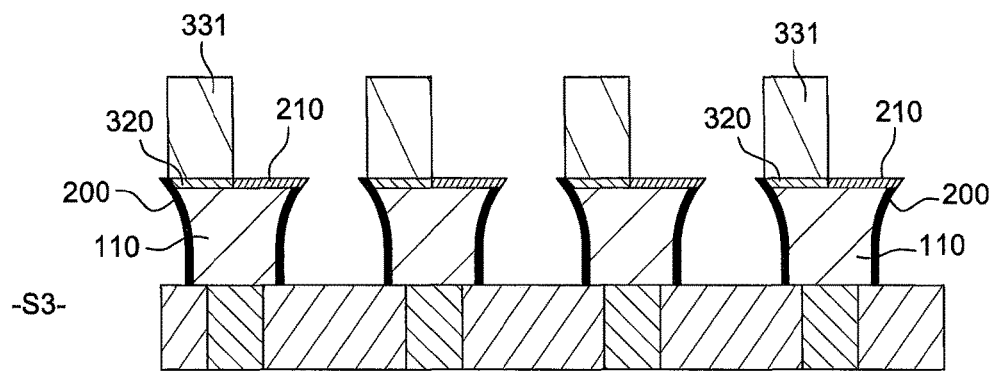
Figure 13D:
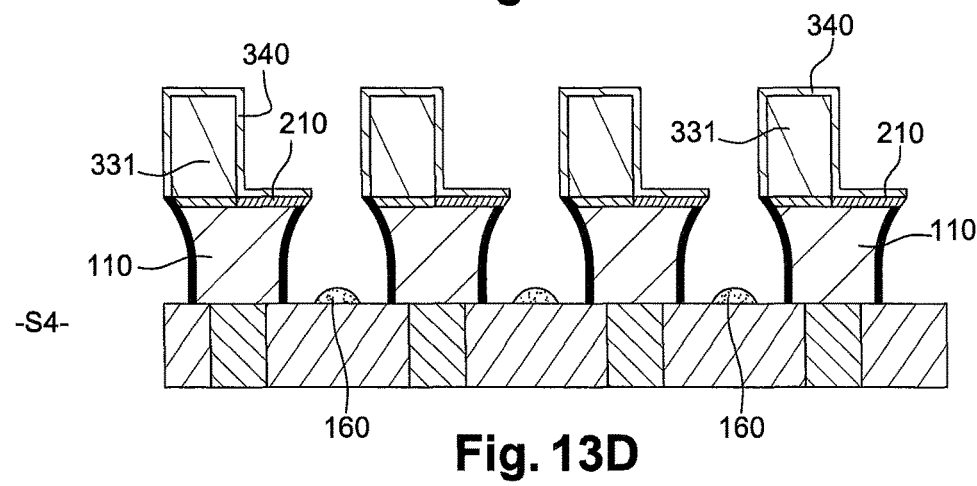

FIG. 13C represents the optional step S3 of oxidation of the sides of the pillars 110, after removal of the etching mask. When this step takes place, the protective layer 320 enables the upper face of the pillars 110 to remain electrically conductive. In the above example, a ruthenium oxide 210 forms in the portion of layer 320 arranged at the top of each pillar 110 and not covered by the spacer pad 331. Of course, rather than a material of which the oxide is conductive, the protective layer 320 may be formed of a material of which the nitride (reference 210) is conductive (in this case, step S3 is a nitridation) or of a noble metal (the oxidation or the nitridation leaves the layer 320 intact). Furthermore, an insulating layer made of oxide (or nitride) 200 forms on the sides of the pillars 110.

In S4 (FIG. 13D), the phase change material (PCM) is deposited by PVD, preferentially by cathode sputtering, at the tops of the pillars 110, on the one hand, and between the pillars 110, on the other hand. A PCM layer 340 covers the spacers 331, including their lateral walls (on account of the angular opening of this mode of deposition), and the ruthenium oxide layer 210. Residual deposits 160 of PCM form at the bottom of the trenches separating the pillars 110.

PVD makes it possible to obtain a PCM layer 340 of substantially constant thickness on the lateral walls of the spacer pads 331. Moreover, the height of the spacer pads 331 (i.e. the thickness of the dielectric layer 330) is advantageously comprised between 50 nm and 100 nm. This makes it possible to obtain good thermal confinement and thus minimise the energy to supply during operation of the memory.

The programming current of the memory point is reduced when the thickness of the PCM layer 340 is reduced. The thickness of the PCM layer 340 on the lateral walls of the spacer pads 331 is preferably comprised between 4 nm and 50 nm so that the electrical consumption of the memory device is controlled. The layer 340 deposited by cathode sputtering generally has a ratio of around 2:1 between the thickness deposited on the upper face of the spacer pads 331 and the thickness deposited on their lateral walls. This ratio may be reduced by forming spacer pads 331 provided with sloping rather than vertical lateral walls. The ratio then tends towards 1:1 when the angle of inclination of the lateral walls (with respect to the upper face of the pads 331) comes close to 180°.

The phase change material is an alloy based on chalcogenide materials, such as germanium, antimony and tellurium (e.g. GeSbTe, GeTe, GeSb, SbTe). This alloy may be doped with one or more other chemical elements, such as N, C, Si, Se, In, Sn, Ag, or instead combined with a dielectric material such as SiO, SiN and TiO.

Figure 13E:
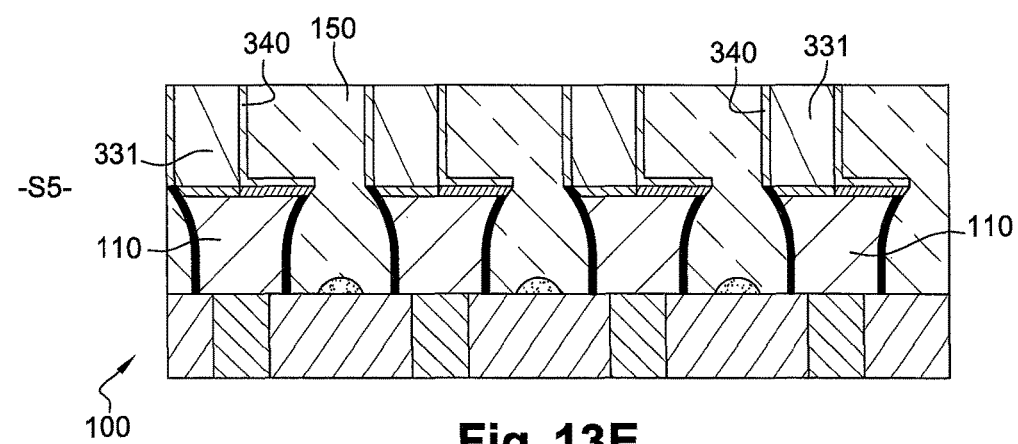

During step S5 represented by FIG. 13E, the trenches between the conductive pillars 110 and between the spacer pads 331 are filled with dielectric material 150. Beforehand, a barrier layer made of nitride (e.g. SiN) may be deposited on the PCM, in order to protect it from oxidation by the dielectric material (when it is an oxide). This barrier layer is particularly advantageous in the case of confined PCRAM, because the active layer of PCM is thin (4-50 nm).

As previously, it is preferable to cover entirely the nanostructures formed on the substrate 100 with dielectric material 150, then to level the surface of the material by polishing until the surface of the spacer pads 331 and the PCM layer 340 that covers their sides is reached.

Finally, in S6 (FIG. 13F), a metallisation level 350 is formed on the flat surface of the dielectric filling material 150. This level 350 may comprise metal lines 140, forming electrical contacts for several memory points simultaneously, embedded in a dielectric layer 141. Preferably, each metal line 140 of the level 350 covers at least one part of a spacer pad 331 and the PCM layer 340 arranged against one of the lateral walls of said pad.

Preferably, the metallisation level 350 is produced according to a "damascene" method. The metal lines 140 advantageously comprise a first metal layer 140a having good adhesion on the phase change material (e.g. Ti, Ta). This first layer 140a covers the bottom and the lateral walls of the trenches formed in the dielectric layer 141. Then, a metal second layer 140b, having a conductivity greater than that of the adhesion layer 140a (e.g. Al), constitutes the core of the metal lines 140.

This metallisation level 350 generally constitutes one of the reading buses of the memory points, either the word bus (word line) or the bit bus (bit line), whereas the interconnection patterns 102 of the substrate 100 are conductive vias as seen previously. The metal lines 140 of the level 350 may extend perpendicularly to the section plane of FIG. 13F or parallel to this section plane, depending on the manner in which the other metallisation level (i.e. vias 102) has been defined.

Figure 13F:
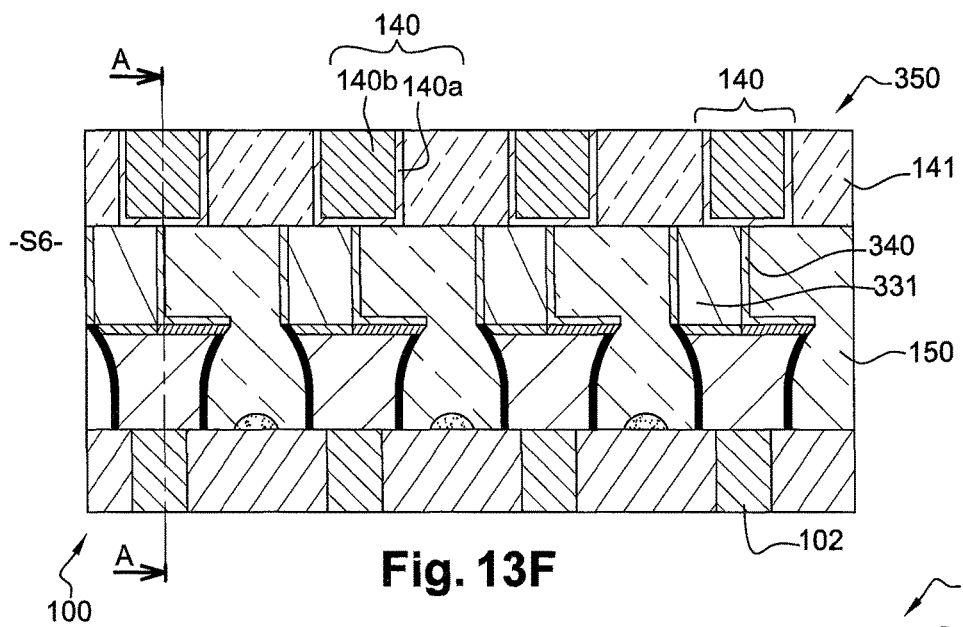
Figure 14:
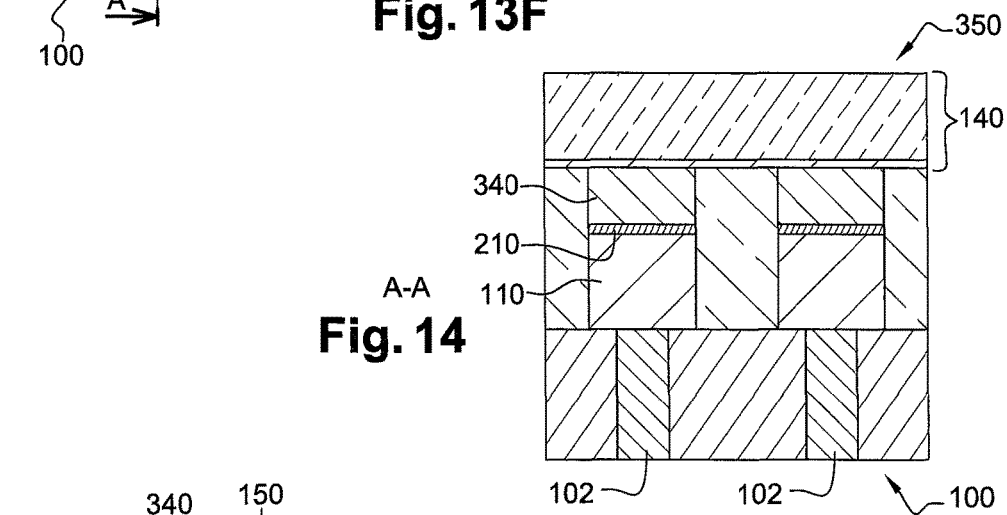
FIG. 14 represents two adjacent memory points of the confined hybrid MRAM/PCRAM resistive device along the plane of section A-A of FIG. 13F.

FIG. 14 represents, as an example, two confined PCRAM memory points situated in the plane of section A-A of FIG. 13F. Each memory point comprises successively a conductive pillar 110, a protective RuO layer 210 and a PCM layer 340. The two memory points are electrically connected by means of the upper metallisation level 350 but may nevertheless be individualised thanks to the interconnection patterns 102 of the substrate 100.

A certain number of steps of the method for manufacturing the MRAM matrix memory (FIGS. 4A-G) and the method for manufacturing the confined PCRAM matrix memory (FIGS. 13A-F) may be shared, in order to produce efficiently MRAM/PCRAM hybrid memories. Since the two types of memory rest on flared conductive pillars, the steps of formation of these pillars in the first portion and the second portion of the substrate may be carried out simultaneously. The step of filling with dielectric material 150 (deposition followed by potential planarization) and the step of forming the upper electrical contacts 140 are other examples of steps that can be shared.

Consequently, only the steps of forming spacer pads 330 and depositing phase change material are specific to the method for manufacturing the confined PCRAM matrix memory. During these steps, the first portion of the substrate reserved for magnetic memory points may be covered by a sacrificial material, and conversely when it is the turn of the magnetic memory points to be formed. The nitride layer 330 is thus limited to the portion reserved for the PCRAM matrix.

During step S5 of opening the contacts (FIG. 13E), chemical mechanical polishing (CMP) may alter the phase change material layer 340. Indeed, a phenomenon of overetching of the PCM is observed, due to the fact that the abrasive planarization solution (slurry) chemically reacts with the PCM. Yet, this over-etching may be detrimental for forming an electrical contact of quality between the confined PCM layer and the metal line of the upper interconnection level 350.

Figure 15:
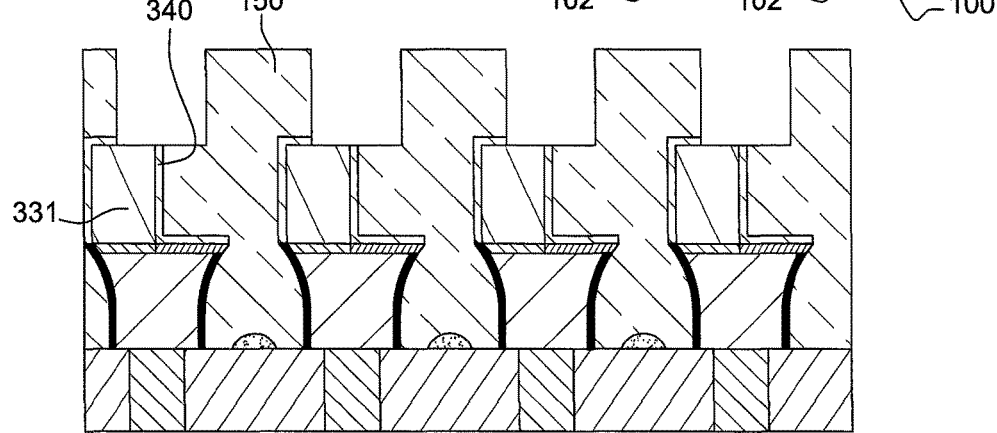
FIG. 15 represents an alternative embodiment of the step S5 of FIG. 13E.

FIG. 15 represents another, more advantageous, manner of accessing the confined PCM layer 340 (and the portion of spacer 331) to make contact therewith. In this alternative embodiment of step S5, chemical mechanical planarization of the dielectric material 150 is replaced by a step of plasma etching. This etching step is here particularly simple to implement, even when the memory points are very close to each other, because the memory points are already individualised thanks to the use of pillars. The constraints on the etching mask may thus be relaxed.

The invention claimed is:

1. A method for manufacturing a resistive device, comprising:
   depositing a first electrically conductive layer on a substrate;

forming an etching mask on the first electrically conductive layer;

etching the first electrically conductive layer through the etching mask, such as to obtain a plurality of electrically conductive pillars separated from one another; and forming storage elements of variable electrical resistance at the tops of the electrically conductive pillars, such that each storage element is supported by one of the electrically conductive pillars, the step of forming the storage elements comprising the following operations:

depositing a first layer by non-collimated cathode sputtering at normal incidence relative to the substrate; and depositing a second layer on the first layer by cathode sputtering, the second layer comprising a first chemical species sputtered at an oblique incidence.

2. The method according to claim 1, wherein the second layer of the storage elements comprises a second chemical species different from the first chemical species and sputtered at normal incidence relative to the substrate at the same time as the first chemical species.

3. The method according to claim 1, wherein the substrate is rotationally driven when the first chemical species is sputtered at an oblique incidence.

4. The method according to claim 1, wherein the first electrically conductive layer is etched such that the electrically conductive pillars have a section at their base smaller than at their top.

5. The method according to claim 4, wherein the first electrically conductive layer is etched by reactive plasma etching.

6. The method according to claim 5, wherein the first electrically conductive layer is etched by an inductive plasma generated by applying a radiofrequency electromagnetic field of a power comprised between 100 W and 500 W under a polarisation voltage comprised between 15 V and 1 kV.

7. The method according to claim 5, wherein the etching of the first electrically conductive layer successively includes:

an anisotropic etching of an upper portion of the first electrically conductive layer, configured such as to obtain vertical sides covered by a passivation layer;

an isotropic etching of a lower portion of the first electrically conductive layer, the isotropic etching of the vertical sides of the upper portion being prevented by said passivation layer.

8. The method according to claim 5, wherein the first electrically conductive layer comprises upper and lower sub-layers formed of different conductive materials, the etching of the first electrically conductive layer successively including:

an anisotropic etching of the upper sub-layer selectively with respect to the lower sub-layer;

an isotropic etching of the lower sub-layer selectively with respect to the upper sub-layer.

9. The method according to claim 1, further comprising:

depositing a second electrically conductive layer on the storage elements, resulting in covering elements superimposed on the storage elements;

filling the a space between the electrically conductive pillars, between the storage elements and between the covering elements with a dielectric material;

forming an electrical contact at a surface of each covering element.

10. The method according to claim 1, further comprising forming a layer made of electrically insulating material on the sides of the electrically conductive pillars.

11. The method according to claim 10, wherein the material of the first electrically conductive layer is selected from the group consisting of tantalum, tungsten, aluminium, titanium, titanium nitride and doped polycrystalline silicon, and wherein the layer made of electrically insulating material on the sides of the electrically conductive pillars is obtained by oxidation of the material of the first electrically conductive layer.

12. The method according to claim 11, comprising the deposition of a layer made of noble metal, ruthenium or chromium on the first electrically conductive layer, before forming the etching mask.

13. The method according to claim 10, wherein the material of the first electrically conductive layer is tantalum or doped polycrystalline silicon, and wherein the layer made of electrically insulating material on the sides of the electrically conductive pillars is obtained by nitridation of the material of the first electrically conductive layer.

14. The method according to claim 13, comprising the deposition of a titanium layer on the first electrically conductive layer, before forming the etching mask.

15. The method according to claim 10, wherein the layer made of electrically insulating material (200) on the sides of the electrically conductive pillars is obtained by forming dielectric spacers.

16. The method according to claim 1, wherein the formation of storage elements at the tops of the electrically conductive pillars comprises the deposition of a magnetic tunnel junction in a first portion of the substrate and the deposition of a layer of phase change material in a second portion of the substrate, the method further comprising the formation of spacer pads at the tops of the conductive pillars situated in the second portion of the substrate, before the deposition of the layer of phase change material.

17. A method for manufacturing a resistive device, comprising:

forming vertical interconnection structures of damascene type made of electrically conductive material on a substrate, said vertical interconnection structures being distributed within a dielectric layer;

thinning the dielectric layer such as to free at least partially said vertical interconnection structures; and forming storage elements of variable electrical resistance at the tops of the vertical interconnection structures, such that each storage element is supported by one of the vertical interconnection structures, the step of forming storage elements comprising the following operations:

depositing a first layer by non-collimated cathode sputtering at normal incidence relative to the substrate; and depositing a second layer on the first layer by cathode sputtering, the second layer comprising a first chemical species sputtered at an oblique incidence.

18. The method according to claim 17, wherein the dielectric layer is thinned by means of an isotropic etching that is selective with respect to the conductive material.

19. The method according to claim 17, wherein the vertical interconnection structures of damascene type are formed by depositing the dielectric layer on the substrate, by etching cavities in the dielectric layer, by filling the cavities with conductive material and by removing the excess of conductive material outside of the cavities by polishing.

20. The method according to claim 18, further comprising depositing a layer made of electrically insulating material on the lateral walls of the cavities, before filling the cavities with conductive material.

* * * * *